(12) United States Patent
Sugizaki et al.

(10) Patent No.: US 11,309,284 B2
(45) Date of Patent: Apr. 19, 2022

(54) SOLID-STATE IMAGE CAPTURING APPARATUS AND ELECTRONIC DEVICE FOR ACQUIRING A NORMAL IMAGE AND A NARROW BAND IMAGE

(71) Applicant: SONY CORPORATION, Tokyo (JP)

(72) Inventors: Taro Sugizaki, Kanagawa (JP); Isao Hirota, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/512,398

(22) PCT Filed: Sep. 25, 2015

(86) PCT No.: PCT/JP2015/077010
§ 371 (c)(1),
(2) Date: Mar. 17, 2017

(87) PCT Pub. No.: WO2016/056396
PCT Pub. Date: Apr. 14, 2016

(65) Prior Publication Data
US 2017/0278826 A1 Sep. 28, 2017

(30) Foreign Application Priority Data
Oct. 6, 2014 (JP) .............................. JP2014-205677

(51) Int. Cl.
*H01L 25/065* (2006.01)
*H01L 27/144* (2006.01)
(Continued)

(52) U.S. Cl.
CPC .......... *H01L 25/0657* (2013.01); *G02B 5/008* (2013.01); *G02B 5/20* (2013.01);
(Continued)

(58) Field of Classification Search
CPC ................. H01L 25/0657; H01L 27/14; H01L 27/14621; H01L 27/00; H01L 27/144;
(Continued)

(56) References Cited

U.S. PATENT DOCUMENTS 8,581,307 B1 * 11/2013 Chen .................. H01L 27/1461
257/222
2010/0285630 A1 * 11/2010 Lee .................... H01L 27/14636
438/70
(Continued)

FOREIGN PATENT DOCUMENTS

JP 06-204445 A 7/1994
JP 2013-070030 A 4/2013
(Continued)

*Primary Examiner* — Thao X Le
*Assistant Examiner* — Laura M Dykes
(74) *Attorney, Agent, or Firm* — Chip Law Group

(57) ABSTRACT

The present technology relates to a solid-state image capturing apparatus and an electronic device that can acquire a normal image and a narrow band image at the same time. The solid-state image capturing apparatus includes a plurality of substrates laminated in two or more layers, and two or more substrates of the plurality of substrates have pixels that perform photoelectric conversion. At least one substrate of the substrates having the pixels is a visible light sensor that receives visible light, and at least another substrate of the substrates having the pixels is a narrow band light sensor that includes narrow band filters being optical filters permeating light in a narrow wavelength band, and receives narrow band light in the narrow band.

18 Claims, 28 Drawing Sheets

(51) Int. Cl.
    *H01L 27/00*      (2006.01)
    *G02B 5/20*       (2006.01)
    *H01L 27/14*      (2006.01)
    *H04N 5/369*      (2011.01)
    *G02B 5/28*       (2006.01)
    *G02B 5/00*       (2006.01)
    *H01L 27/146*     (2006.01)
    *H04N 5/374*      (2011.01)
    *H01L 31/028*     (2006.01)
    *H01L 31/0296*    (2006.01)
    *H01L 31/0304*    (2006.01)
    *H01L 31/0328*    (2006.01)

(52) U.S. Cl.
    CPC ............. *G02B 5/204* (2013.01); *G02B 5/288* (2013.01); *H01L 27/00* (2013.01); *H01L 27/14* (2013.01); *H01L 27/144* (2013.01); *H01L 27/14621* (2013.01); *H01L 27/14627* (2013.01); *H01L 27/14636* (2013.01); *H01L 27/14645* (2013.01); *H01L 27/14649* (2013.01); *H04N 5/374* (2013.01); *H04N 5/379* (2018.08); *H01L 31/028* (2013.01); *H01L 31/02966* (2013.01); *H01L 31/0328* (2013.01); *H01L 31/03044* (2013.01); *H01L 31/03046* (2013.01); *H01L 31/03048* (2013.01)

(58) Field of Classification Search
    CPC ......... H01L 27/14627; H01L 27/14636; H01L 27/14645; H01L 27/14649; H01L 31/028; H01L 31/02966; H01L 31/03044; H01L 31/03046; H01L 31/03048; H01L 31/0328; G02B 5/008; G02B 5/20; G02B 5/204; G02B 5/288; H04N 5/374; H04N 5/379
    USPC ....................................................... 257/432
    See application file for complete search history.

(56) References Cited

U.S. PATENT DOCUMENTS

| | | | |
|---|---|---|---|
| 2013/0062522 A1* | 3/2013 | Jiang ................. | H01L 27/14609 250/338.4 |
| 2014/0362228 A1* | 12/2014 | McCloskey .............. | H04N 5/33 348/164 |
| 2015/0054962 A1* | 2/2015 | Borthakur .............. | H04N 5/332 348/164 |
| 2016/0133659 A1* | 5/2016 | Chao ..................... | H01L 27/146 257/231 |
| 2016/0245698 A1* | 8/2016 | Pau ........................ | G01J 3/2803 |
| 2017/0033139 A1* | 2/2017 | Lu ..................... | H01L 27/14621 |

FOREIGN PATENT DOCUMENTS

| | | |
|---|---|---|
| JP | 2014-130890 A | 7/2014 |
| JP | 2014-135535 A | 7/2014 |

* cited by examiner

| Detection items | Pass band (wavelength) |
|---|---|
| · Vegetation; chlorophyll | Especially 435, 680nm |
| · Tasty component; oleic acid & myoglobin | 600~970nm |
| · Freshness; moisture | Near-infrared to 1935nm |
| · Sugar; | 874, 902nm |
| · β-carotene | 350~550nm, especially 448nm |
| · Stratum corneum, epidermis, basal cell (blotch) | UV, visible light |
| · Dermis (resilient, wrinkle), body fat, defect | Near-infrared |
| · Skin color, oil | White light |
| · Melanin | Red (660nm) + near-infrared (880nm) |
| · Hemoglobin | Green (570nm) + red (660nm) |
| · Pore (clogged, porphyrin) | UV |
| · Grains, component analysis | Near-infrared |
| · Food calorie measurement | 1146, 1726, 1896, 2306nm |
| · Pesticide residue, DESIR method | 1680, 2100, 2180nm |
| · Contamination detection in food | Near-infrared |

SOLID-STATE IMAGE CAPTURING APPARATUS AND ELECTRONIC DEVICE FOR ACQUIRING A NORMAL IMAGE AND A NARROW BAND IMAGE

CROSS REFERENCE TO RELATED APPLICATIONS

This application is a U.S. National Phase of International Patent Application No. PCT/JP2015/077010 filed on Sep. 25, 2015, which claims priority benefit of Japanese Patent Application No. JP 2014-205677 filed in the Japan Patent Office on Oct. 6, 2014. Each of the above-referenced applications is hereby incorporated herein by reference in its entirety.

TECHNICAL FIELD

The present technology relates to a solid-state image capturing apparatus and an electronic device, and in particular to a solid-state image capturing apparatus and an electronic device that can acquire a normal image and a narrow band image at the same time, for example.

BACKGROUND ART

As a narrow band light sensor that senses (captures) light in a narrow wavelength band, there are a multispectral sensor and a hyperspectral sensor, for example.

The multispectral sensor can sense (capture) light plural wavelength bands at the same time. The hyperspectral sensor can sense (capture) light from visible light to infrared by dividing into hundreds of wavelength bands.

The bands of light to be sensed (captured) by the narrow band light sensor are narrow, thereby lowing the sensitivity. In addition, when the narrow band light sensor uses a plasmon filter utilizing surface plasmon, a conversion efficiency of a photoelectric conversion by the narrow band light sensor is lowered.

Also, as the bands of light to be sensed (captured) by the narrow band light sensor are narrow, it is difficult to cover all regions of the visible light. Therefore, it is difficult to provide a high image quality spectrum (image) (hereinafter also referred to as a normal image) by synthesizing light spectral data provided by sensing (capturing) light by the narrow band light sensor.

The present applicant has been proposed before a CMOS image sensor that two layers for performing a photoelectric conversion are laminated (for example, see Patent Literature 1).

CITATION LIST

Patent Literature

Patent Literature 1: Japanese Patent Application Laid-open No. 2013-070030

DISCLOSURE OF INVENTION

Technical Problem

A visible light sensor that senses (captures) visible light can sense (capture) a normal image, but it is difficult to sense (capture) specific narrow band light and a narrow band image corresponding to a plurality of narrow bands light.

On the other hand, the narrow band light sensor can sense (capture) a narrow band image corresponding to narrow band light, but it is difficult to provide the normal image corresponding to visible light having an image quality equivalent to a visible light sensor.

The present technology is attained in view of the situation, and is to acquire a normal image having a high image quality and a narrow band image having a high wavelength resolution at the same time.

Solution to Problem

A solid-state image capturing apparatus according to the present technology includes a plurality of substrates laminated in two or more layers, two or more substrates of the plurality of substrates having pixels that perform photoelectric conversion, at least one substrate of the substrates having the pixels being a visible light sensor that receives visible light, at least another substrate of the substrates having the pixels being a narrow band light sensor that includes narrow band filters being optical filters permeating light in a narrow wavelength band, and receives narrow band light in the narrow band.

An electronic apparatus according to the present technology includes an optical system that collects light, and a solid-state image capturing apparatus that receives light and captures an image, the solid-state image capturing apparatus including a plurality of substrates laminated in two or more layers, wo or more substrates of the plurality of substrates having pixels that perform photoelectric conversion, at least one substrate of the substrates having the pixels being a visible light sensor that receives visible light, at least another substrate of the substrates having the pixels being a narrow band light sensor that includes narrow band filters being optical filters permeating light in a narrow wavelength band, and receives narrow band light in the narrow band.

In the solid-state image capturing apparatus and the electronic apparatus according to the present technology, a plurality of substrates are laminated in two or more layers, and two or more substrates of the plurality of substrates have pixels that perform photoelectric conversion. At least one substrate of the substrates having the pixels is a visible light sensor that receives visible light. At least another substrate of the substrates having the pixels is a narrow band light sensor that includes narrow band filters being optical filters permeating light in a narrow wavelength band, and receives narrow band light in the narrow band.

The solid-state image capturing apparatus may be an independent apparatus, or may be an internal block configuring one apparatus.

Advantageous Effects of Invention

According to the present technology, a normal image having a high image quality and a narrow band image having a high wavelength resolution can be acquired at the same time.

It should be noted that the effect described here is not necessarily limitative and may be any effect described in the present disclosure.

BRIEF DESCRIPTION OF DRAWINGS

FIG. 7 is a table showing examples of wavelengths of a pass band of an narrow band filter 42.

FIG. 24 is a diagram showing an example of a known array (CFA (Color filter Array) of an OCCF having a W filter.

MODE(S) FOR CARRYING OUT THE INVENTION

<Embodiment of Digital Camera to which the Present Technology is Applied>

Figure 1:
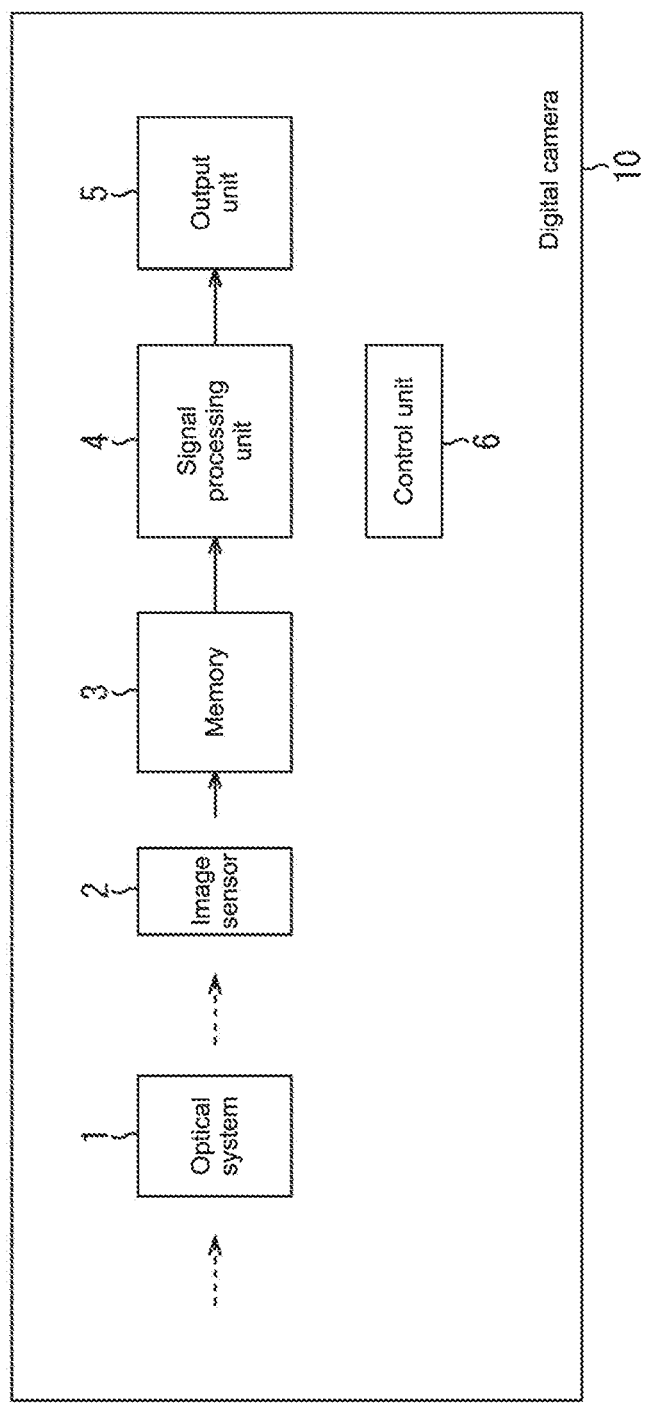
FIG. 1 is a block diagram showing a configuration example of an embodiment of a digital camera 10 to which the present technology is applied.

FIG. 1 is a block diagram showing a configuration example of an embodiment of a digital camera 10 to which the present technology is applied.

The digital camera 10 can capture both of a still image and a moving image.

In FIG. 1, the digital camera 10 includes an optical system 1, an image sensor 2, a memory 3, a signal processing unit 4, an output unit 5, and a control unit 6.

The optical system 1 includes a zoom lens (not shown), a focus lens, a diaphragm, etc., for example, and allows external light to be incident on the image sensor 2.

The image sensor 2 is, for example, a CMOS image sensor, receives incident light from the optical system 1, performs a photoelectric conversion, and outputs image data corresponding to the incident light from the optical system 1.

Although the detail of the image sensor 2 will be described later, the image sensor 2 is, in short, configured of a plurality of substrates by laminating two or more layers. Two or more of the plurality of substrates include pixels that perform the photoelectric conversion, and at least one of the substrate having the pixels is a visible light sensor that receives visible light. Furthermore, at least other one of the substrate having the pixels has narrow band filters each of which is an optical filter permeating light in a narrow wavelength band, and forms a narrow band light sensor receiving narrow band light.

Accordingly, the image sensor 2 receives visible light and performs the photoelectric conversion (sensing (capturing)) to sense (capture) a normal image corresponding to the visible light, and, at the same time, receives light in one or more narrow bands (hereinafter also referred to as narrow band light) and performs the photoelectric conversion to sense (capture) a narrow band image corresponding to the narrow band light.

That is to say, the image sensor 2 can acquire the normal image and the narrow band image at the same time.

In the image sensor 2, the narrow band light sensor has, as described above, the narrow band filters. Therefore, as the narrow band (wavelength band) of light that is permeated through the narrow band filters, a variety of narrow bands are adopted, thereby measuring various items provided by the narrow band light as the narrow band image.

In other words, the narrow band light sensor can measure (detect) various items provided by the narrow band light including chlorophyll, moisture, heat, oleic acid, sugar (sugar content) and others, for example as the narrow band image.

The memory 3 temporary stores image data (normal image and narrow band image) output by the image sensor 2.

The signal processing unit 4 performs signal processing using the image data stored in the memory 3, for example, noise reduction, white balance adjustment, etc., and feeds to the output unit 5.

The output unit 5 outputs the image data from the signal processing unit 4.

Specifically, the output unit 5 includes, for example, a display (not shown) configured of liquid crystal, etc., and displays a spectrum (image) corresponding to the image data from the signal processing unit 4 as a so-called through image.

The output unit 5 includes, for example, a driver (not shown) for driving a recording medium such as a semiconductor memory, a magnetic disc, and an optical disc, and records the image data from the signal processing unit 4 to the recording medium.

Furthermore, the output unit 5 functions as a communication interface that communicates with an external apparatus (not shown), and transmits the image data from the signal processing unit 4 to the external apparatus wireless or wired.

The control unit 6 controls each block configuring the digital camera 10 according to a user's operation, etc.

In the digital camera 10 configured as above, the image sensor 2 receives the incident light from the optical system 1, photoelectrically converts the incident light to sense (capture) the normal image and the narrow band image at the same time, and outputs the normal image and the narrow band image.

The image data output by the image sensor 2 is fed and stored to the memory 3. The image data stored to the memory 3 is subjected to the signal processing by the signal processing unit 4 as necessary, and the resultant image data is fed to the output unit 5, and is output.

<Use Example of Digital Camera 10>

Figure 2:
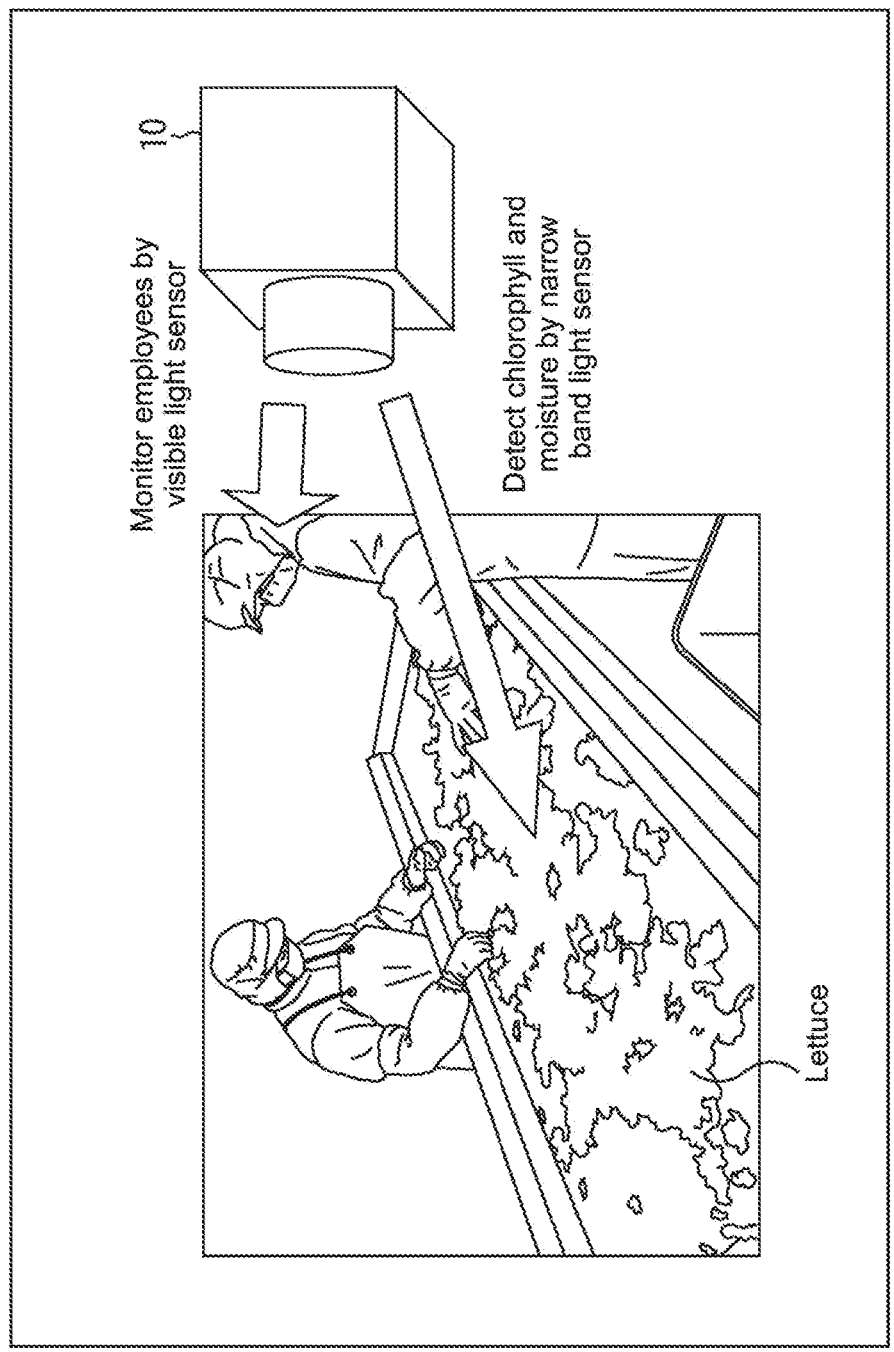
FIG. 2 shows a first use example of the digital camera 10.

FIG. 2 shows a first use example of the digital camera 10.

(The image sensor 2 of) the digital camera 10 can sense (capture) the normal image, and can detect various items provided from the narrow band light as the narrow band image. Therefore, the digital camera 10 can be utilized in a variety of cases that sensing (capturing) the normal image and detection of the various items provided from the narrow band light at the same time.

FIG. 2 shows the use example that the digital camera 10 is used as a monitoring camera for a lettuce factory.

In the digital camera 10 in FIG. 2, the normal image and the narrow band image that capture the line where lettuce is processed are sensed (captured) at the same time.

By the normal image provided by sensing (capturing) with the digital camera 10, employees working at the line where lettuce is processed can be monitored such that the employees work by the book, and the number of the employees is complete. Furthermore, by the normal image, invasion of suspicious persons can be monitored on break time, night time, holidays, etc. when the employees are not present, for example.

By the narrow band image, for example, chlorophyll and moisture in lettuce are detected, and freshness of lettuce can be monitored (controlled). Furthermore, by the narrow band image, infrared rays are detected to monitor (control) whether or not the employee is feverish, for example.

Figure 3:
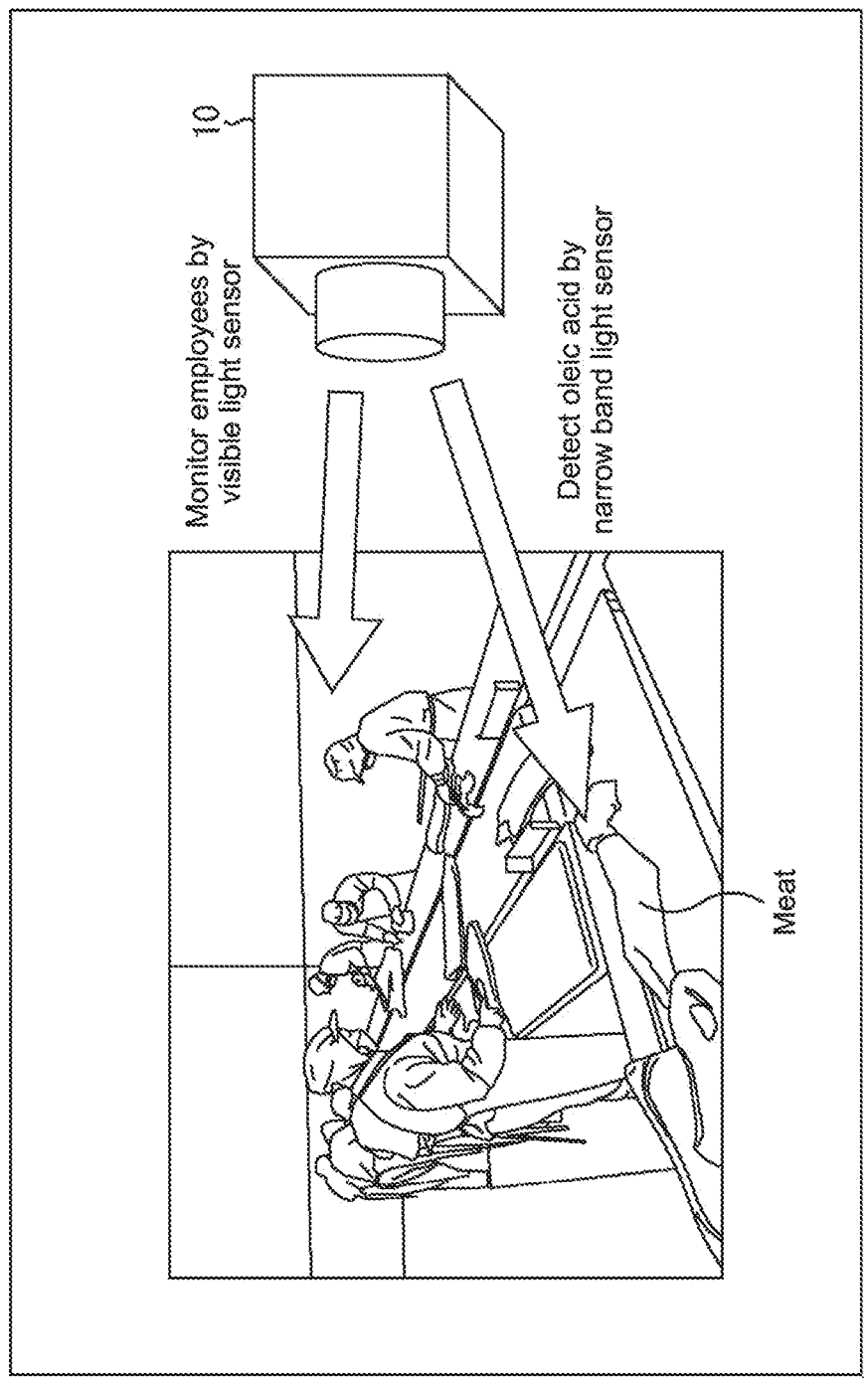
FIG. 3 shows a second use example of the digital camera 10.

FIG. 3 shows a second use example of the digital camera 10.

Specifically, FIG. 3 shows the use example that the digital camera 10 is used as a monitoring camera for a meat factory.

In the digital camera 10 in FIG. 3, the normal image and the narrow band image that capture the line where meat is processed are sensed (captured) at the same time.

By the normal image provided by sensing (capturing) with the digital camera 10, employees working at the line where meat is processed can be monitored such that the employees work by the book, and the number of the employees is complete. Furthermore, by the normal image, invasion of suspicious persons can be monitored on break time, night time, holidays, etc. when the employees are not present, for example.

By the narrow band image, for example, oleic acid that is a tasty component of meat is detected, and freshness of meat can be monitored. Furthermore, by the narrow band image, infrared rays are detected to monitor whether or not the employee is feverish, for example.

Figure 4:
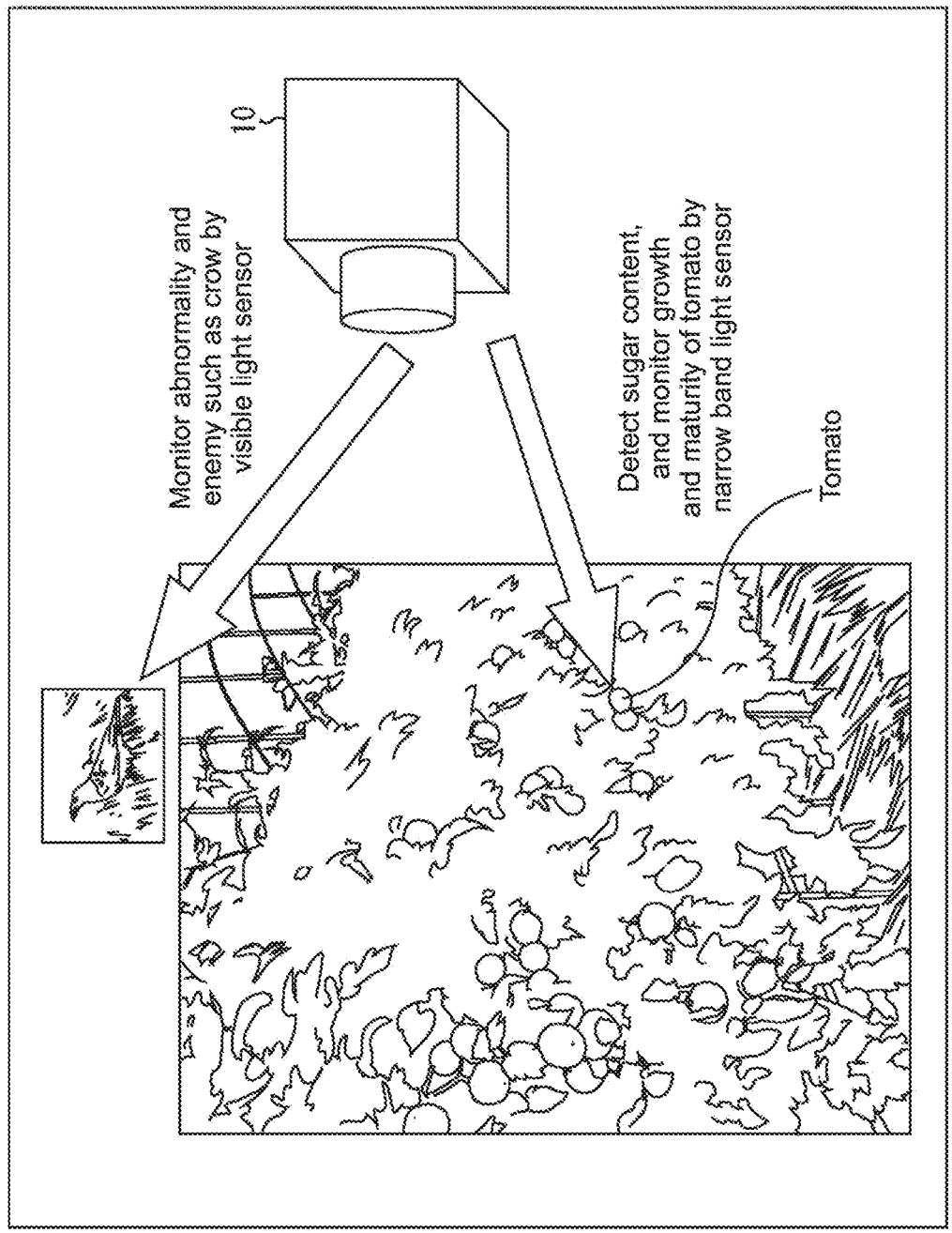
FIG. 4 shows a third use example of the digital camera 10.

FIG. 4 shows a third use example of the digital camera 10.

FIG. 4 shows the use example that the digital camera 10 is used as a monitoring camera for a tomato farm.

In the digital camera 10 in FIG. 4, the normal image and the narrow band image that capture the tomato farm are sensed (captured) at the same time.

By the normal image provided by sensing (capturing) with the digital camera 10, an enemy such as a crow, invasion of suspicious persons, other abnormal can be monitored, for example.

By the narrow band image, a sugar content of tomato is detected, and a growth (maturity) of tomato can be monitored.

<First Configuration Example of Image Sensor 2>

Figure 5:
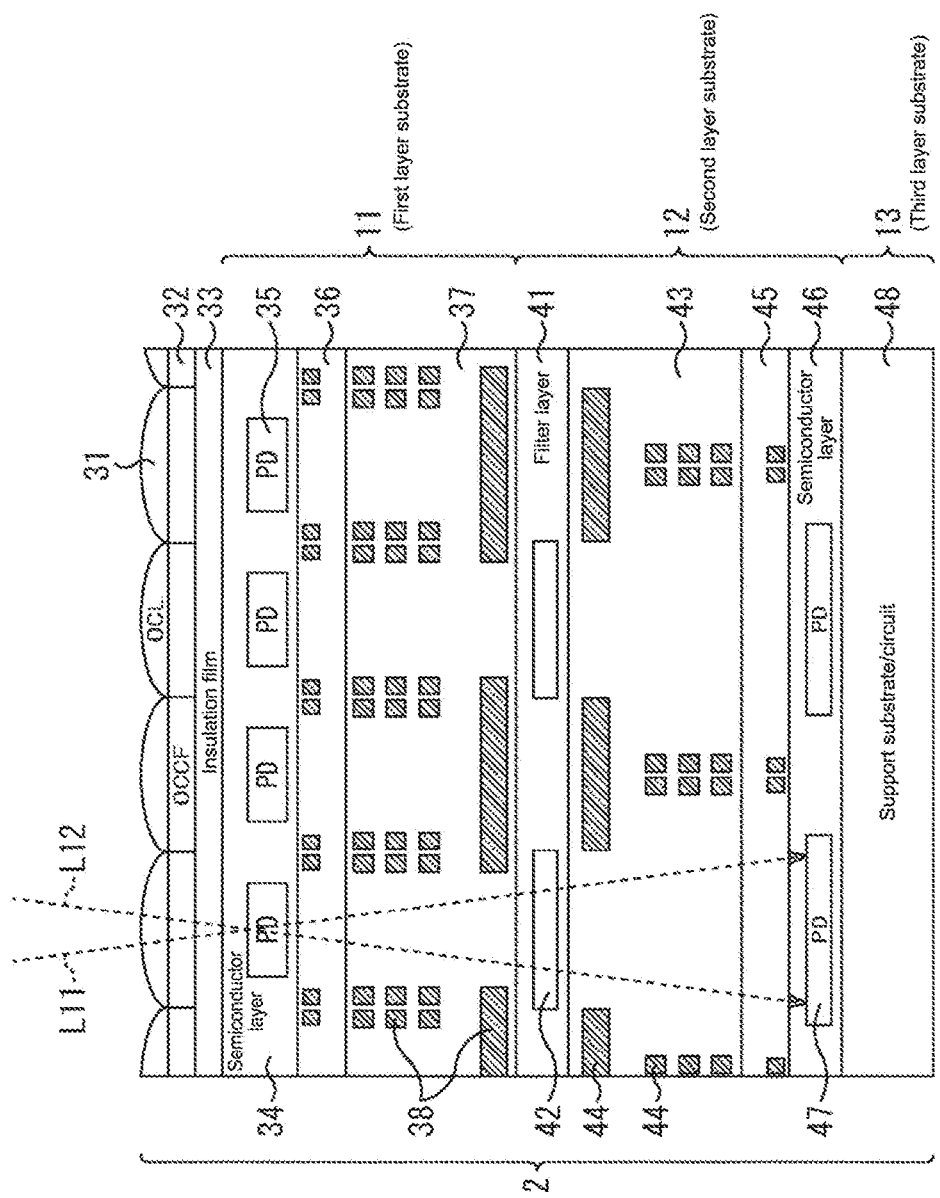
FIG. 5 is a cross-sectional view showing a first configuration example of an image sensor 2.

FIG. 5 is a cross-sectional view showing a first configuration example of an image sensor 2 (in a horizontal direction or a vertical direction).

In FIG. 5, the image sensor 2 includes a plurality of substrates where three semiconductor substrates: a first layer substrate, a second layer substrate, and a third layer substrate are laminated.

Here, in this embodiment, an upper layer is defined as a side of the image sensor 2 on which light is incident (upside in this embodiment), and a lower layer is defined as a side opposite to the side on which light is incident.

Also, the substrate laminated on the upper layer is referred to as an upper layer substrate, and the substrate laminated on the lower layer is referred to as a lower layer substrate. The second layer substrate and the third layer substrate are the lower layer substrates to the first layer substrate, and the first layer substrate and the second layer substrate are the upper layer substrates.

Two or more substrates among the three from the first layer substrate to the third layer substrate configuring the image sensor 2 are the substrates having pixels that perform the photoelectric conversion. At least one substrate of the substrates having pixels is a visible light sensor 11 that receives visible light, and at least another substrate of the substrates having pixels has narrow band filters 42 and is a narrow band light sensor 12 that receives narrow band light.

Specifically, in the image sensor 2 in FIG. 5, as the first layer substrate and the second layer substrate among the three from the first layer substrate to the third layer substrate, the visible light sensor 11 and the narrow band light sensor 12 are adopted for the substrates having pixels that perform the photoelectric conversion.

In addition, in the image sensor 2 in FIG. 5, as the third layer substrate, a circuit board 13 having a memory, a logic circuit, etc. is adopted.

Here, at a region that is not an effective pixel region of the image sensor 2, vias (not shown) are disposed. The visible light sensor 11, the narrow band light sensor 12, and the circuit board 13 are electrically connected via the vias.

In FIG. 5, the visible light sensor 11 as the first layer substrate is configured by laminating the semiconductor layer 34, the Poly layer 36 and the wiring layer 37 from the upper layer.

On the semiconductor layer 34, a plurality of PDs (Photo Diodes) 35 being the pixels are formed. On the PDs 35 being the pixels, an OCL (On Chip Lenz) 31 and an OCCF (On Chip Color Filter) 32 are disposed. Specifically, in FIG. 5, at a rear side (upper layer side) that is a light incident surface of the semiconductor layer 34, the insulation film 33 is formed, and the OCCF 32 and the OCL 31 are formed.

The OCL 31 collects the incident light on the PDs 35 as the corresponding pixels via the corresponding OCCF 32 and the insulation film 33.

The OCCF 32 permeates light having a predetermined color of the light from the corresponding OCL 31. As a color array of the OCCF 32, a Bayer array, or other known array can be adopted. Also as the color array of the OCCF 32, an array provided by partly modifying the known array such as the Bayer array can be adopted.

The PDs 35 receive the light incident through the OCL 31, the OCCF 32 and the insulation film 33, and photoelectrically convert it.

Here, the semiconductor layer 34 having the PDs 35 may have a thickness (film thickness) of, for example, about 2.7 um (micro meter).

Also, as the PDs 35, Si PDs (PDs including Si as a material) may be adopted, for example.

At a surface side (lower layer side) opposing to the light incident surface of the semiconductor layer 34, the Poly layer 36 and the wiring layer 37 are formed.

On the Poly layer 36, (a gate of) a transfer transistor or the like that transfers a signal (charge) that is photoelectrically converted at the PDs 35 being the pixels.

Within the wiring layer 37, wiring 38 made of metal such as Cu and Al is disposed, for example.

Although four layers wiring 38 is disposed within the wiring layer 37, the number of the layers of the wiring 38 disposed within the wiring layer 37 is not limited to four.

Also, in FIG. 5, the lowest layer wiring 38 among the four layers wiring 38 disposed within the wiring layer 37 also functions as a light shielding layer that partly shields the light incident on the lower layer narrow band light sensor 12 of the visible light sensor 11. Note that the light shielding layer that partly shields the light incident on the lower layer narrow band light sensor 12 of the visible light sensor 11 may be disposed separately from the wiring 38.

In FIG. 5, at the lower layer side of the wiring layer 37 of the visible light sensor 11, the narrow band light sensor 12 is disposed as the second layer substrate.

The narrow band light sensor 12 is configured of a filter layer 41, a wiring layer 43, a Poly layer 45 and a semiconductor layer 46 laminated from the upper layer side.

The filter layer 41 includes one or more narrow band filters 42 that are optical filters that permeate light in a narrow wavelength band. In the filter layer 41, the narrow band filters 42 are disposed for the PDs 47 being the pixels described later.

Here, the narrow band means that, for example, in terms of a visible light wavelength band (for example, about 380 nm (nano meters) to 780 nm), one band divided by the visible light wavelength band equally into 10 or more.

A pass band as the narrow band of the light permeated through each narrow band filter 42 is determined by the item to be detected from the narrow band image. For example, as described in FIG. 2, when chlorophyll is detected from the narrow band image, the narrow band including 435 nm and 680 nm is determined for the pass band of the narrow band filter 42.

The narrow band filter 42 may be configured by mixing an organic material used in the OCCF, for example, with a pigment that permeates light at a desirable narrow band (or absorbs light in a non-desirable narrow band).

Also, as the narrow band filter 42, a plasmon filter utilizing surface plasmon, and a Fabry-Perot interferometer can be adopted. When the plasmon filter is adopted as the narrow band filter 42, a variety of pass bands can be realized only by changing a hole diameter and a frequency of holes formed in a metal thin film configuring the plasmon filter.

At the lower layer side of the filter layer 41, the wiring layer 43 is disposed. In FIG. 5, on the wiring layer 43, the four layers wiring 44 is disposed similar to the wiring layer 37. Note that the number of the layers of the wiring 44 disposed within the wiring layer 43 is not limited to four similar to the wiring layer 37.

At the lower layer side of the wiring layer 43, the Poly layer 45 and the semiconductor layer 46 are disposed.

In the Poly layer 45, (a gate of) a transfer transistor of a transfer transistor that transfer the signal (charge) photoelectrically converted at the PDs 47 being the pixels formed in the semiconductor layer 46.

In the semiconductor layer 46, a plurality of the PDs 47 being the pixels are formed similar to the semiconductor layer 34.

The PDs 47 are, for example, Si PDs, for example, similar to the PDs 35, receive the light permeated through the visible light sensor 11 and further permeated through the narrow band filters 42 corresponding to the PDs 47, and photoelectrically convert.

Here, a distance between (a lower part of) the semiconductor layer 34 of the visible light sensor 11 as the first layer substrate and (an upper part of) the semiconductor layer 46 of the narrow band light sensor 12 as the second layer substrate may be about 10 um to 13 um. However, the distance between the semiconductor layer 34 and the semiconductor layer 46 is not limited to the range from about 10 um to 13 um.

A relationship between the PDs 35 being the pixels of the visible light sensor 11 and the PDs 47 being the pixels of the narrow band light sensor 12 is not especially limited.

Specifically, for example, one PD 47 being one pixel of the narrow band light sensor 12 is disposed for one PD 35 being one pixel of the visible light sensor 11.

Also, for example, one PD 47 being one pixel of the narrow band light sensor 12 can be disposed for one PD 35 being one pixel of the visible light sensor 11.

Furthermore, for example, plural PDs 47 being plural pixels of the narrow band light sensor 12 can be disposed for one PD 35 being one pixel of the visible light sensor 11.

In FIG. 5, one PD 47 of the narrow band light sensor 12 being one pixel is disposed for one PD 35 being one pixel of the visible light sensor 11.

Alternatively, for example, the PDs 47 being the pixels of the narrow band light sensor 12 may be disposed not only to all pixels of the visible light sensor 11, but also only to a part of the pixels.

For example, the PDs 47 being the pixels of the narrow band light sensor 12 may be disposed for the PDs 35 every predetermined numbers as a predetermined number of the pixels.

In FIG. 5, the PDs 47 being the pixels of the narrow band light sensor 12 are disposed for the PDs 35 every one pixel (every one PD 35) in a horizontal direction and a vertical direction of the visible light sensor 11, respectively.

Otherwise, the PDs 47 being the pixels of the narrow band light sensor 12 may be disposed for the position where no PDs 35 being the pixels of the visible light sensor 11 are disposed.

Specifically, for example, the PDs 47 being the pixels of the narrow band light sensor 12 and the PDs 35 being the pixels of the visible light sensor 11 may be arranged so as to configure a check pattern (alternately in a horizontal direction and a vertical direction).

Alternatively, for example, the PDs 47 of the narrow band light sensor 12 may be disposed only at the region of a part of the effective pixel region on which the PDs 35 being the pixels are disposed of the visible light sensor 11.

In FIG. 5, the circuit board 13 is disposed as the third layer substrate at the lower layer side of the semiconductor layer 46 of the narrow band light sensor 12.

Furthermore, the PDs 35 being the pixels of the narrow band light sensor 12 may have a same size or a different (large or small) size of the PDs 35 being the pixels of the visible light sensor 11.

The circuit board 13 is configured of a support substrate that supports the visible light sensor 11 and the narrow band light sensor 12, and a circuit such as a memory and a logic circuit.

A circuit necessary for sensing (capturing) a spectrum (image) at the visible light sensor 11 such as a PLL (Phase Lock Loop) for generating a clock, a DAC (Digital to Analog Converter) generating a reference signal used in a so-called column parallel type AD conversion that A/D converts the signal acquired by the photoelectric conversion at the PDs 35 and the like may be disposed on the semiconductor layer 34, etc. of the visible light sensor 11. Among the necessary circuits, the circuit that may be disposed on a substrate separately from the visible light sensor 11 may be disposed not on the visible light sensor 11, but on the circuit board 13. The same applies to a circuit necessary for sensing (capturing) a spectrum (image) at the narrow band light sensor 12.

As described above, when the circuit that may be disposed on the separate substrate is disposed on the circuit substrate 13 among the circuit necessary for sensing (capturing) the spectrum (image) at the visible light sensor 11 and the circuit necessary for sensing (capturing) the spectrum (image) at the narrow band light sensor 12, it is possible to configure the visible light sensor 11 and the narrow band light sensor 12 smaller by the area of the circuit.

Also, a circuit that applies additional signal processing to the spectrum (image) sensed (captured) by the visible light sensor 11 and the narrow band light sensor 12 may be disposed on the circuit board 13.

In the image sensor 2 configured as above, the PDs 35 being the pixels of the visible light sensor 11 receive the light incident through the OCL 31, the OCCF 32 and the insulation film 33, and photoelectrically convert.

A part of the light incident on the PDs 35 being the pixels of the visible light sensor 11 is not photoelectrically converted in the PDs 35, permeates the PDs 35, and is incident on the narrow band filter 42 of the filter layer 41 via (passing through) the Poly layer 36 and the wiring layer 37. The light in a predetermined narrow band (narrow band light) of the incident light is permeated through the narrow band filters 42.

The narrow band light permeated through the narrow band filters 42 is incident on the semiconductor layer 46 via the wiring layer 43 and the Poly layer 45. The narrow band light incident on the semiconductor layer 46 is received at the PDs 47 being the pixels of the narrow band light sensor 12, and is photoelectrically converted.

Accordingly, for example, in FIG. 5, light L11, L12 is received at the PDs 35 being the pixels of the visible light sensor 11, and is photoelectrically converted. Also, a part of the light L11, L12 permeates through the PDs 35 and the narrow band filters 42, and becomes the narrow band light, and is incident on the PDs 47 of the narrow band light sensor 12 as the pixel. Then, the narrow band light is received at the PDs 47 being the pixels of the narrow band light sensor 12, and is photoelectrically converted.

Here, the wiring 38 and the wiring 44 in the wiring layer 37 and the wiring layer 43, respectively are arranged such that an optical path of the light permeated though the PDs 35 to the PDs 47 and the narrow band filters 42 corresponding to the PDs 47 is ensured. In other words, the wiring 38 and the wiring 44 are, for example, arranged in a part other than the upper parts of the PDs 47 (and the narrow band filters 42).

Also, the Poly layers 36 and 45 are configured such that an optical path of the light permeated though the PDs 35 to the PDs 47 and the narrow band filters 42 corresponding to the PDs 47 is ensured. Although FIG. 5 (also, FIG. 10, FIG. 11, and, FIG. 16 described later) shows lines for representing boundaries among the respective layers in order to easily distinguish the Poly layer 36, the wiring layer 37, the filter layer 41, the wiring layer 43 and the Poly layer 45, the Poly layer 36, the wiring layer 37, the filter layer 41, the wiring layer 43 and the Poly layer 45 are formed with a same transparent material such as, for example, $SiO_2$, and the boundaries among the respective layers are not necessarily present in an actual device.

As described above, in the image sensor 2, the visible light sensor 11 that receives visible light, and the narrow band light sensor 12 that receives narrow band light having the narrow band filters 42 that permeate the narrow band light are laminated, whereby the visible light and the narrow band light can be received at the same time, and the normal image corresponding to the visible light and the narrow band image corresponding to the narrow band light viewed from the same angle can be acquired at the same time.

Also, as the visible light sensor 11 and the narrow band light sensor 12 are laminated, a necessary number of pixels are disposed on the visible light sensor 11 and the narrow band light sensor 12 respectively, whereby the normal image having a necessary image quality (resolution) and the narrow band image a necessary image quality can be acquired at the same time.

A timing to sense (capture) the normal image in the visible light sensor 11 and a timing to sense (capture) the narrow band image in the narrow band light sensor 12 may be the same, or different. The same applies to an exposure time in each of the visible light sensor 11 and the narrow band light sensor 12.

The timing to sensing (capturing) and the exposure time of the normal image in the visible light sensor 11 and the timing to sensing (capturing) and the exposure time of the narrow band image in the narrow band light sensor 12 may be controlled by an on/off timing by a transistor such as a transfer transistor (not shown) configuring the pixels.

The normal image sensed (captured) by the visible light sensor 11 can be corrected to be a normal image having a higher image quality using the narrow band image sensed (captured) by the narrow band light sensor 12.

Figure 6:
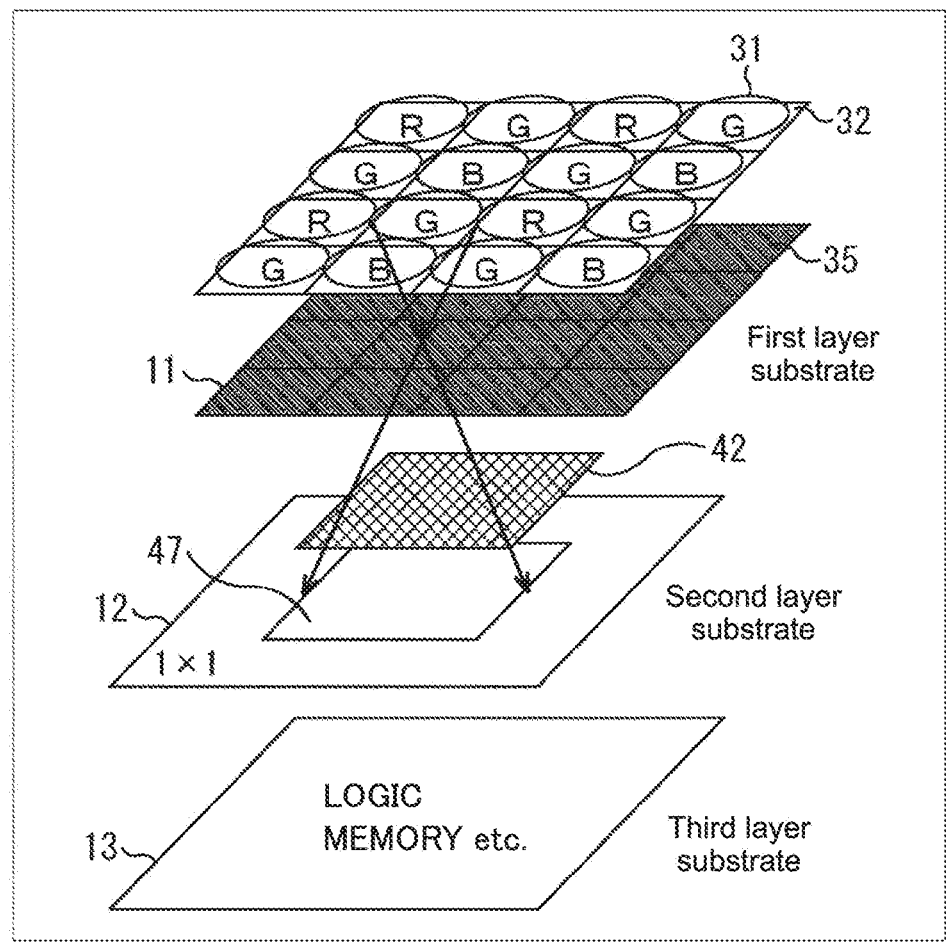
FIG. 6 is a schematic perspective view showing a first configuration example of the image sensor 2.

FIG. 6 is a schematic perspective view showing a first configuration example of the image sensor 2 in FIG. 5.

In FIG. 6, the image sensor 2 is configured by laminating three from the first layer substrate to the third layer substrate.

The first layer substrate forms the visible light sensor 11, the second layer substrate forms the narrow band light sensor 12, and the third layer substrate forms the circuit board 13, respectively.

In the image sensor 2 in FIG. 6, as the color array of the OCCF 32, the Bayer array is adopted. In other words, in the OCCF 32, a basic unit of the Bayer array is a color filter having 2×2 (column×row) pixels where an upper left is red (R), a lower right is blue (B), and a lower left and an upper right are green (G), and the basic units are arranged repeatedly in a horizontal (row) direction and a vertical (column) direction.

In FIG. 6, the PD 47 being one pixel of the narrow band light sensor 12 is formed for the PD 35 being every 4×4 pixels of the visible light sensor 11.

Here, in FIG. 5, the PD 47 being one pixel of the narrow band light sensor 12 is formed for the PD 35 being every one pixel in the horizontal direction and the vertical direction of the visible light sensor 11. However, in FIG. 6, to avoid the complicated drawing, the PD 47 being one pixel of the narrow band light sensor 12 is formed for the PD 35 being every 4×4 pixels of the visible light sensor 11. The same applies to the perspective views described later.

In FIG. 6, the PD 47 being one pixel of the narrow band light sensor 12 formed for the PD 35 being every 4×4 pixels of the visible light sensor 11 is arranged to receive the light permeated through the pixel in a 3rd row from upper and a 2nd column from left being one pixel of the 4×4 pixels of the visible light sensor 11 and through the narrow band filter 42.

Here, in FIG. 6, the pixel in the 3rd row from upper and the 2nd column from left of the 4×4 pixels of the visible light sensor 11 is a G pixel that receives light permeated through a green (light permeating) color filter.

Accordingly, in FIG. 6, the PD 47 as the pixel of the narrow band light sensor 12 receives light permeated through the G pixel, i.e., light permeated through the green color filter (furthermore, narrow band light permeated through Si configuring the PD 35 being the pixel of the visible light sensor 11 and through the narrow band filter 42).

The pass band being the narrow band of the light permeated through the narrow band filter 42 is determined by an item to be detected from the narrow band image (hereinafter also referred to as a detection item).

FIG. 7 is a table showing examples of wavelengths of a pass band of the narrow band filters 42 for detection a variety of detection items.

As shown in FIG. 7, for example, when chlorophyll is detected as the detection item, the narrow band mainly including 435 nm and 680 nm is determined for the pass band of the narrow band filters 42.

Figure 8:
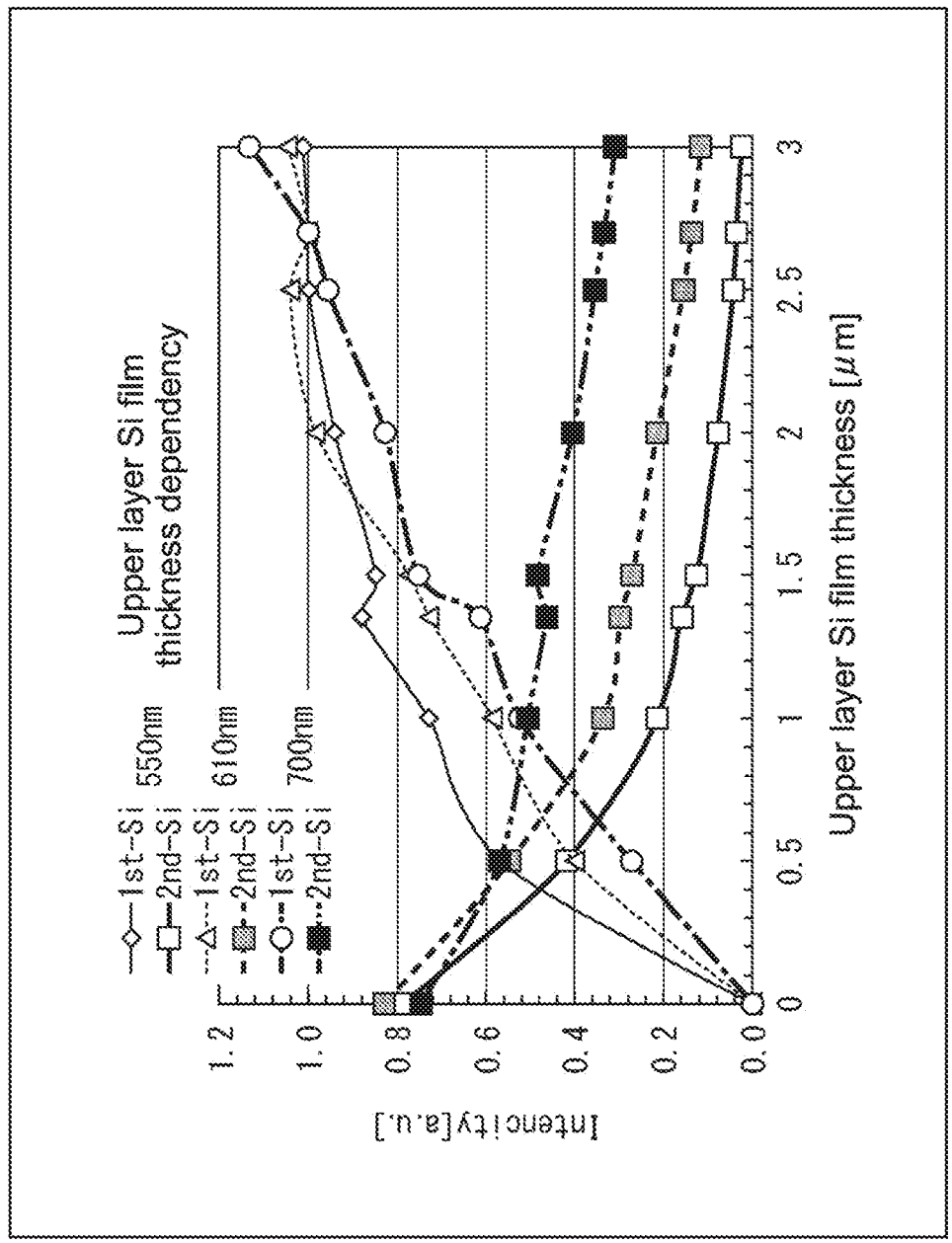
FIG. 8 is a simulation result by an optical simulator.

FIG. 8 is a simulation result by an optical simulator showing a relationship between a thickness of the semiconductor layer 34 having the PDs 35 of the visible light sensor 11 as the first layer substrate, and light intensity received at the PDs 35 and light intensity received at the PDs 47 of the semiconductor layer 46 of the narrow band light sensor 12 as the second layer substrate.

In FIG. 8, an upper layer Si film thickness in a horizontal axis represents a thickness of the semiconductor layer 34 of the visible light sensor 11 as the first layer substrate, a vertical axis represents light intensity.

In the simulation by the optical simulator, light having a wavelength of 550 nm, 610 nm, or 700 nm is set to incident light and is incident on the image sensor 2, the light intensity of the light received at the PDs 35 of the visible light sensor 11 as the first layer substrate and the light intensity of the light received at the PDs 47 of the narrow band light sensor 12 as the second layer substrate are calculated.

From the simulation result, it may be confirmed that the light intensity (1st-Si) at the PDs 35 of the visible light sensor 11 as the first layer substrate increases as the upper layer Si film thickness increases by the light having any wavelength of 550 nm, 610 nm and 700 nm.

Also, from the simulation result, it may be confirmed that the light intensity (2nd-Si) at the PDs 47 of the narrow band light sensor 12 as the second layer substrate decreases as the upper layer Si film thickness increases by the light having any wavelength of 550 nm, 610 nm and 700 nm.

The PDs 47 of the narrow band light sensor 12 as the second layer substrate receives the light permeated through Si as (the semiconductor substrate 34 having) the PDs 35 of the visible light sensor 11 as the first layer substrate, i.e., the light not absorbed by Si of the PDs 35.

Since the light permeated through Si of the PDs 35 is light at a long wavelength side having a long penetration length, the configuration that the PDs 47 of the narrow band light sensor 12 as the second layer substrate receive the light permeated through Si of the PDs 35 is suitable to receive the narrow band light at a relatively long wavelength side.

As shown by the simulation result in FIG. 8, to what degree permeates, i.e., arrives the PDs 47, the light a certain wavelength through Si of the PDs 35 depends on the thickness of Si of the PDs 35 (upper layer Si film thickness).

From the simulation result in FIG. 8, it may be confirmed that, when the upper layer Si film thickness is 2.7 um, about 15% of the light incident on Si of the PDs 35 arrives the PDs 47 of the narrow band light sensor 12 as the second layer substrate as to the light having a wavelength of 610 nm (red light) (shaded rectangles).

Furthermore, from the simulation result in FIG. 8, when the visible light sensor 11 is arranged at the upper layer and the narrow band light sensor 12 is arranged at the lower layer, in order to realize the specification that the light having the light intensity of about 10 to 15% or more of the light incident on the visible light sensor 11 being the upper layer is received at the narrow band light sensor 12 being the lower layer, for example, as to the light having a wavelength of 610 nm, it is desirable that a total thickness of the Si layer that the light permeates before arriving at the narrow band light sensor 12 being the lower layer be about 3 um or less.

Here, in the CMOS image sensor, the thickness of the Si layer having the PDs is generally about 3 um. Then, supposing that, for example, the thickness of one layer of the Si layer laminated on the image sensor 2 is 3 um, in order to realize the above-described specification, it is desirable that the number of the Si layers arranged at the upper layer of the narrow band light sensor 12 (the Si layer that permeates the light received by the narrow band light sensor 12) may be one.

However, if one Si layer can be extremely thin, for example, as thin as less than 1 um, one or more Si layers may be arranged at the upper layer of the narrow band light sensor 12. Also, in this case, it is desirable that a total thickness of the Si layer arranged at the upper layer of the narrow band light sensor 12 be about 3 um or less in order to realize the above-described specification.

Figure 9:
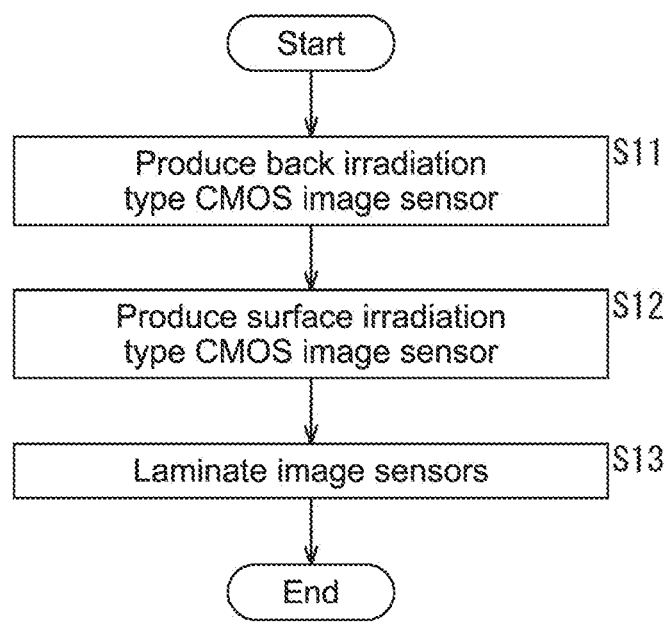
FIG. 9 is a flow chart describing an overview of a method of producing the image sensor 2.

FIG. 9 is a flow chart describing an overview of a method of producing the image sensor 2 in FIG. 5 (and FIG. 6).

In the image sensor 2 in FIG. 5, the visible light sensor 11 has an (almost) similar configuration to a back irradiation type CMOS image sensor, and the narrow band light sensor 12 has an (almost) similar configuration to a surface irradiation type CMOS image sensor.

Accordingly, the image sensor 2 in FIG. 5 can be produced by utilizing the method of producing the back irradiation type CMOS image sensor and the surface irradiation type CMOS image sensor.

That is to say, a production apparatus (not shown) for producing the image sensor 2 in FIG. 5 produces the back irradiation type CMOS image sensor as the visible light sensor 11 in Step S11.

Furthermore, the production apparatus produces the surface irradiation type CMOS image sensor as the narrow band light sensor 12 in Step S12.

Then, by the production apparatus, the back irradiation type visible light sensor 11 produced in Step S11, the surface irradiation type narrow band light sensor 12 produced in Step S12, and the circuit board 13 are laminated, vias are formed for necessary electric connections, the OCL 31 and the OCCF 32 are formed, thereby completing the image sensor 2 in FIG. 5.

The visible light sensor 11 may be configured not of the back irradiation type CMOS image sensor, but of the surface irradiation type CMOS image sensor.

Also, the narrow band light sensor 12 may be configured not of the surface irradiation type CMOS image sensor, but of the back irradiation type CMOS image sensor.

<Second Configuration Example of Image Sensor 2>

Figure 10:
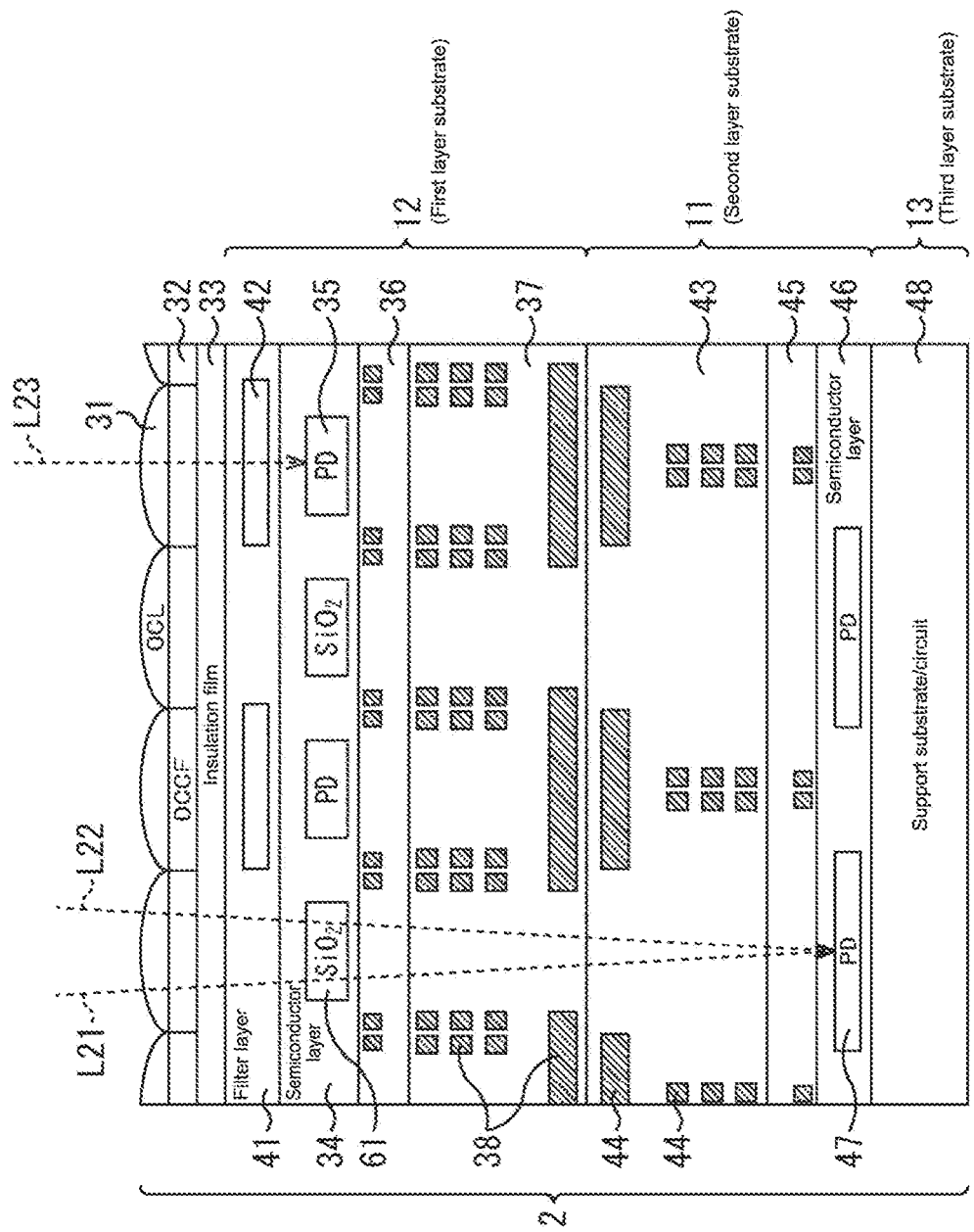
FIG. 10 is a cross-sectional view showing a second configuration example of the image sensor 2.

FIG. 10 is a cross-sectional view showing a second configuration example of the image sensor 2.

Note that, in the drawing, components corresponding to those in FIG. 5 are denoted by the same reference numerals, and thus detailed description thereof will be hereinafter omitted.

In FIG. 5, the visible light sensor 11 and the narrow band light sensor 12 are the first layer substrate and the second layer substrate, respectively, and therefore the visible light sensor 11 is the upper layer substrate, and the narrow band light sensor 12 is the lower layer substrate. However, in FIG. 10, the visible light sensor 11 is the lower layer substrate, and the narrow band light sensor 12 is the upper layer substrate.

In other words, in the image sensor 2 in FIG. 10, among the three from the first layer substrate to the third layer substrate, the narrow band light sensor 12 is adopted as the first layer substrate, and the visible light sensor 11 is adapted as the second layer substrate.

In FIG. 10, the narrow band light sensor 12 as the first layer substrate is configured of the filter layer 41, the semiconductor layer 34, the Poly layer 36 and the wiring layer 37 laminated from the upper layer.

Furthermore, in FIG. 10, in the semiconductor layer 34, the PDs 35 are formed, or a transparent material 61 having high permeability, for example, $SiO_2$, in place of the PDs 35 is formed. In other words, a part where the PDs 35 will be formed is opened, and the opening is filled with $SiO_2$ of the transparent material 61 in the semiconductor layer 34.

At an upper layer side of the semiconductor layer 34, filter layer 41 having the narrow band filter 42 is formed.

In the filter layer 41, the narrow band filters 42 are disposed for the PDs 35 being the pixels in the semiconductor layer 34.

At an upper layer side of the filter layer 41, the insulation film 33, the OCCF 32, and the OCL 31 are disposed in this order toward the direction of the upper layer. Although in FIG. 10, the OCCF 32 is disposed directly after the OCL 31, the OCCF 32 may be disposed between the wiring layer 37 and the wiring layer 43, for example.

The OCL 31 and the OCCF 32 are formed for the PDs 35 being the pixels and the transparent material 61.

In FIG. 10, the visible light sensor 11 being the second layer substrate is disposed at a lower layer side of the wiring layer 37 of the narrow band light sensor 12.

The visible light sensor 11 is configured of the wiring layer 43, the Poly layer 45 and the semiconductor layer 46 laminated from an upper layer side.

In FIG. 10, in the semiconductor layer 46, as described in FIG. 5, the PDs 47 being the pixels are formed. $SiO_2$ of the transparent material 61 of the narrow band light sensor 12 is disposed for the PDs 47 being the pixels of the visible light sensor 11, and is formed at a position that the light received at the PDs 47 is permeated.

In FIG. 10, the wiring 38 and the wiring 44 in the wiring layer 37 and the wiring layer 43 are arranged such that an optical path of the light from $SiO_2$ of the transparent material 61 to the PDs 47 is ensured. In other words, in FIG. 10, the wiring 38 and the wiring 44 are, for example, arranged in a part other than the upper parts of the PDs 47.

The Poly layers 36 and 45 are also configured similar to the wiring layers 37 and 43 such that the optical path of the light from $SiO_2$ of the transparent material 61 to the PDs 47 is ensured.

In the image sensor 2 configured as above, the PDs 35 being the pixels of the narrow band light sensor 12 receives the narrow band light incident through the OCL 31, the OCCF 32, the insulation film 33, and the narrow band filters 42 of the filter layer 41, and photoelectrically converts.

In addition, $SiO_2$ of the transparent material 61 of the narrow band light sensor 12 permeates the light incident via a part where the OCL 31, the OCCF 32, the insulation film 33 and the narrow band filters 42 of the filter layer 41 are not present.

The light permeated through $SiO_2$ of the transparent material 61 is further incident on the semiconductor layer 46 via the Poly layer 36, the wiring layers 37 and 43 and the Poly layer 45. The light incident on the semiconductor layer 46 is received at the PDs 47 being the pixels of the visible light sensor 11, and is photoelectrically converted.

In other words, in FIG. 10, for example, light L21, L22 permeates the OCL 31, the OCCF 32, the insulation film 33, the filter layer 41, $SiO_2$ of the transparent material 61 of the semiconductor layer 34, the wiring layers 38 and 44 and the Poly layer 45, and is incident on the PDs 47 being the pixels of the visible light sensor 11. The light incident on the PDs 47, i.e., the visible light permeated through the OCCF 32 is received at the PDs 47, and is photoelectrically converted.

In addition, in FIG. 10, for example, light L23 is incident on the narrow band filter 42 of the filter layer 41 via the OCL 31, the OCCF 32 and the insulation film 33. As to the light incident on the narrow band filter 42, only the narrow band light in a predetermined narrow band permeates through the narrow band filter 42, is received at the PDs 35 being the pixels of the narrow band light sensor 12, and is photoelectrically converted.

As described above, in the image sensor 2 in FIG. 10, as the narrow band light sensor 12 and the visible light sensor 11 are laminated, similar to the cases in FIG. 5 and FIG. 6, the visible light and the narrow band light can be received at the same time, and the normal image corresponding to the visible light and the narrow band image corresponding to the narrow band light can be acquired at the same time.

<Third Configuration Example of Image Sensor 2>

Figure 11:
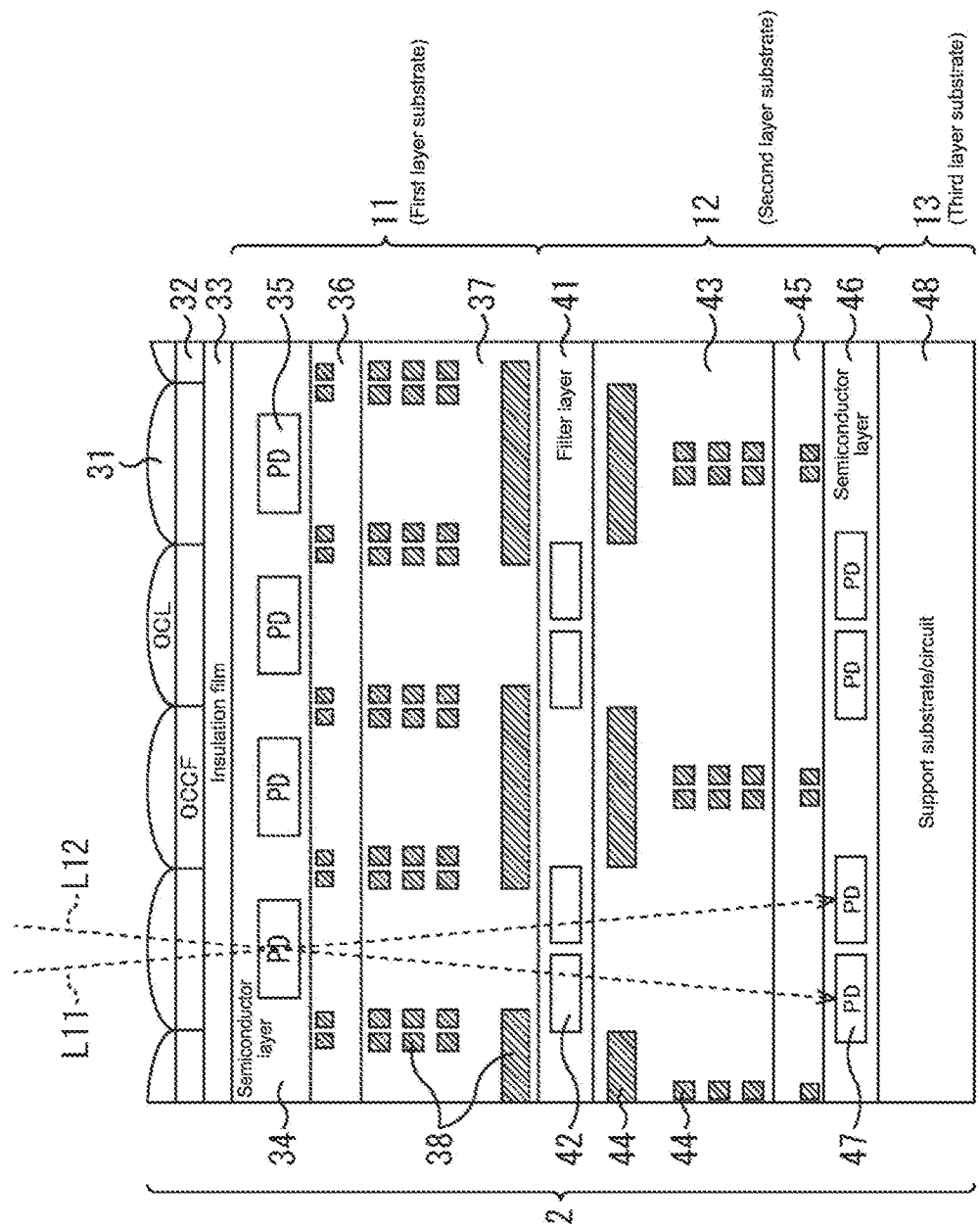
FIG. 11 is a cross-sectional vies showing a third configuration example of the image sensor 2.

FIG. 11 is a cross-sectional vies showing a third configuration example of the image sensor 2.

Note that, in the drawing, components corresponding to those in FIG. 5 are denoted by the same reference numerals, and thus detailed description thereof will be hereinafter omitted.

The image sensor 2 in FIG. 11 is different from the image sensor 2 in FIG. 5 where one PD 47 being one pixel of the narrow band light sensor 12 is disposed for one PD 35 being one pixel of the visible light sensor 11 in that two PDs 47 being two pixels of the narrow band light sensor 12 are disposed for one PD 35 being one pixel of the visible light sensor 11 in the horizontal direction and the vertical direction, respectively.

In other words, in the image sensor 2 in FIG. 5, one PD 47 being one pixel of the narrow band light sensor 12 is disposed for one PD 35 being one pixel of the visible light sensor 11.

In contrast, in the image sensor 2 in FIG. 11, two PDs 47 being two pixels of the narrow band light sensor 12 are disposed for one PD 35 being one pixel of the visible light sensor 11 in the horizontal direction and the vertical direction, respectively.

In addition, in FIG. 11, for example, a distance between the PDs 35 of the visible light sensor 11 and the PDs 47 of the narrow band light sensor 12, other positional relationship, sizes of the PDs 35 and 47 being the pixels, etc. are set such that (a part of) light L11 incident on one PD 35 of the visible light sensor 11 permeates through the PD 35 being one pixel of the visible light sensor 11, and is received at the PD 47 being one pixel of two pixels of the narrow band light sensor 12 for the PD 35 being one pixel, and such that (a part of) other L12 incident on one PD 35 of the visible light sensor 11 permeates through the PD 35 being one pixel of the visible light sensor 11, and is received at the PD 47 being the other pixel of two pixels of the narrow band light sensor 12 for the PD 35 being one pixel.

In addition, in the image sensor in FIG. 11, respective individual narrow band filters 42 are disposed in the filter layer 41 for two PDs 47 being two pixels of the narrow band light sensor 12 disposed for one PD 35 being one pixel of the visible light sensor 11 in the horizontal direction and the vertical direction, respectively.

The narrow band light obtained by permeating through the narrow band filters 42 disposed for the PDs 47 is incident on the PDs 47 being the pixels of the narrow band light sensor 12.

Figure 12:
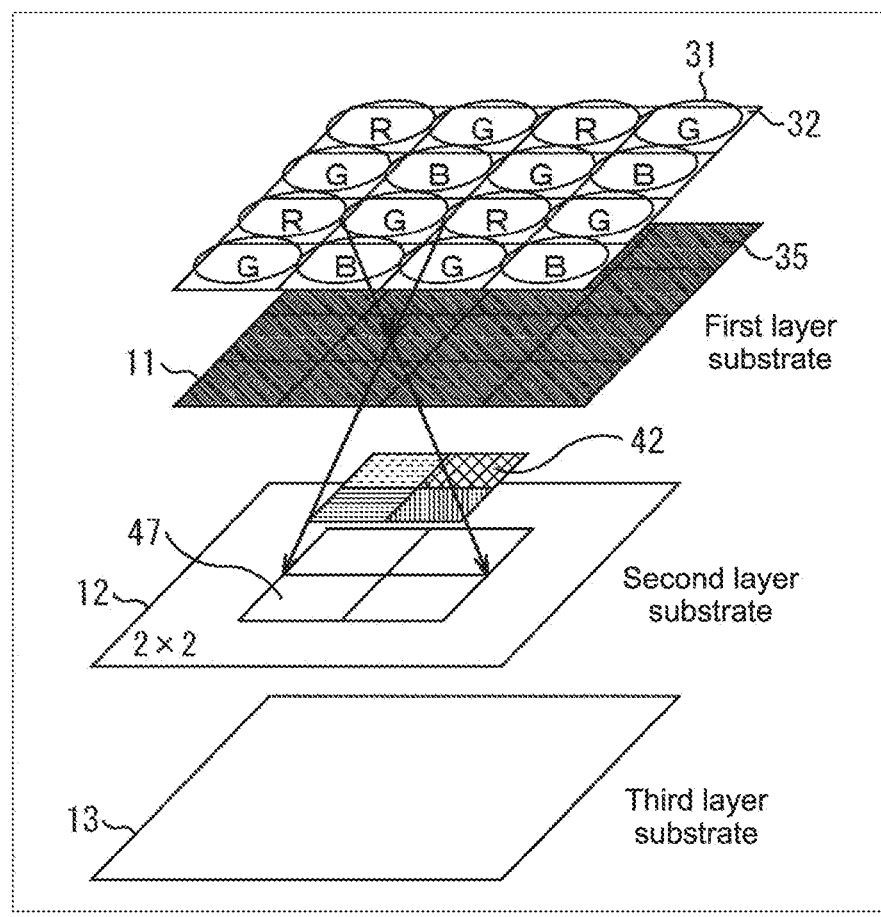
FIG. 12 is a schematic perspective view showing a third configuration example of the image sensor 2.

FIG. 12 is a schematic perspective view showing a third configuration example of the image sensor 2 in FIG. 11.

Note that, in the drawing, components corresponding to those in FIG. 6 are denoted by the same reference numerals, and thus detailed description thereof will be hereinafter omitted.

In the third configuration example of the image sensor 2, as described in FIG. 11, two PDs 47 being two pixels of the narrow band light sensor 12 are disposed for one PD 35 being one pixel of the visible light sensor 11 in the horizontal direction and the vertical direction, respectively.

Accordingly, in the third configuration example of the image sensor 2, as shown in FIG. 12, four PDs 47 being 2×2 pixels of the narrow band light sensor 12 are disposed for one PD 35 being one pixel of the visible light sensor 11.

Thus, the light permeated through one PD 35 being one pixel of the visible light sensor 11 is received at four PDs 47 being 2×2 pixels of the narrow band light sensor 12 disposed for the one pixel.

The individual narrow band filters 42 are disposed for respective four PDs 47 being 2×2 pixels of the narrow band light sensor 12 disposed for one PD 35 being one pixel of the visible light sensor 11.

The narrow band filters 42 disposed for respective four PDs 47 being 2×2 pixels of the narrow band light sensor 12 may be filters having pass bands being mutually different narrow bands, or two of narrow band filters 42 may be filters having a pass band being the same narrow band.

The pass bands of the narrow band filters 42 disposed for the respective four PDs 47 being 2×2 pixels of the narrow band light sensor 12 are determined by detection items to be detected from the narrow band image.

As to the narrow band light having insufficient sensitivity (light intensity) only by one narrow band filter 42 among the narrow band filters 42 disposed for the respective four PDs 47 being 2×2 pixels of the narrow band light sensor 12, a plurality of narrow band filters 42 may be adopted as the narrow band filters for permeating the narrow band light.

In the image sensor 2 in FIG. 12, the light passing through one PD 35 being one pixel of the visible light sensor 11 becomes the narrow band light via the narrow band filter 42, is received at respective four PDs 47 being 2×2 pixels of the narrow band light sensor 12 disposed for one PD 35 being on pixel of the visible light sensor 11, and is photoelectrically converted.

As described above, in the image sensor 2 in FIG. 12, as four PDs 47 being 2×2 pixels of the narrow band light sensor 12 are disposed for one PD 35 being one pixel of the visible light sensor 11, multispectral data can be acquired as the narrow band image corresponding to the narrow band light of four types of narrow bands at most.

Here, in the image sensor 2 in FIG. 12, similar to that in FIG. 6, the light permeated through Si of the PDs 35 being the G pixels that receive the light permeated through the green (light permeating) color filter of the visible light sensor 11 permeates through the narrow band filters 42 to become the narrow band light and to be received at the PDs 47 being the pixels of the narrow band light sensor 12.

As described above, in the image sensor 2 in FIG. 12, four PDs 47 being 2×2 pixels of the narrow band light sensor 12 are disposed for one PD 35 being one pixel of the visible light sensor 11, and the individual narrow band filters 42 are disposed for respective four PDs 47 being 2×2 pixels of the narrow band light sensor 12, thereby receiving the narrow band light in different narrow bands (wavelengths).

In FIG. 12, (four PDs 47 being) 2×2 pixels of the narrow band light sensor 12 are disposed for (one PD 35 being) one pixel of the visible light sensor 11, and respective individual narrow band filters 42 are disposed for 2×2 pixels. Alternatively, plural pixels such as 3×3 pixels, 4×4 pixels, 2×4 pixels and the like other than 2×2 pixels of the narrow band light sensor 12 may be disposed for one pixel of the visible light sensor 11, and individual (plural) narrow band filters 42 are disposed for the plural pixels.

<Fourth Configuration Example of Image Sensor 2>

Figure 13:
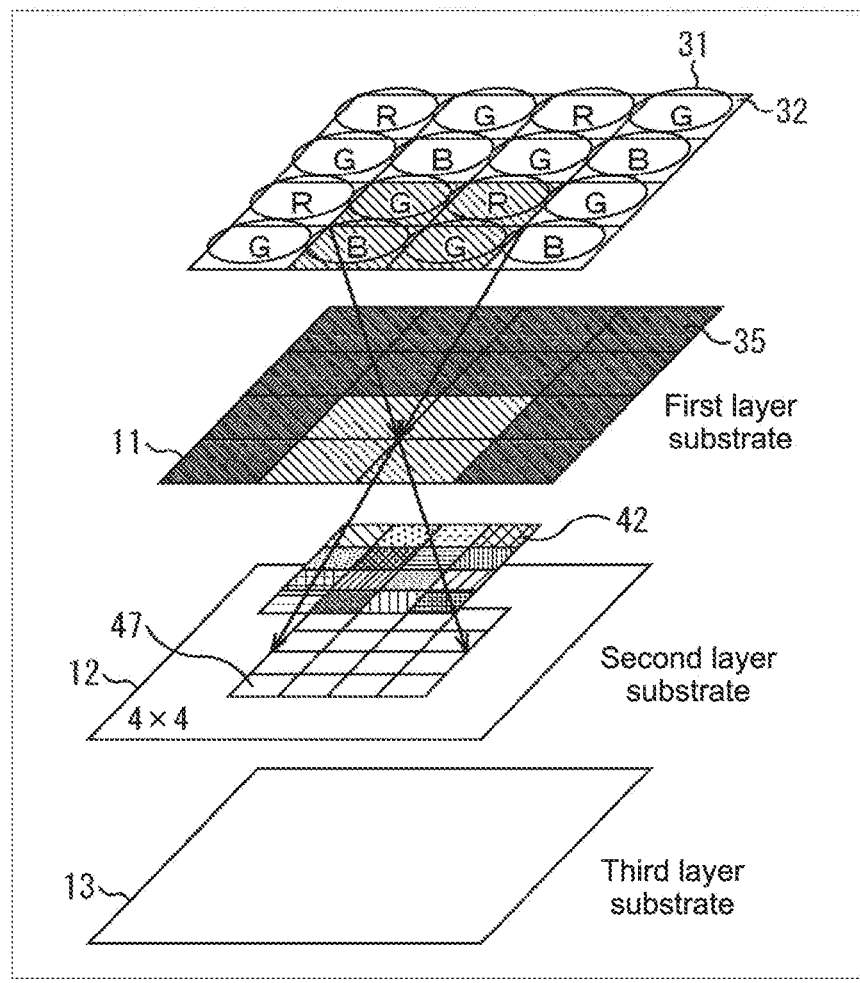
FIG. 13 is a schematic perspective view showing a fourth configuration example of the image sensor 2.

FIG. 13 is a schematic perspective view showing a fourth configuration example of the image sensor 2.

Note that, in the drawing, components corresponding to those in FIG. 12 are denoted by the same reference numerals, and thus detailed description thereof will be hereinafter omitted.

In the fourth configuration example of the image sensor 2, 16 PDs 47 being plural 4×4 pixels of the narrow band light sensor 12 are disposed for four PDs 35 being plural, e.g., 2×2 pixels of the visible light sensor 11.

Thus, the light permeated through four PDs 35 being 2×2 pixels of the visible light sensor 11 is received collectively, in a manner of speaking, at 16 PDs 47 being 4×4 pixels of the narrow band light sensor 12 disposed for 2×2 pixels.

The individual narrow band filters 42 are disposed for 16 PDs 47 being plural 4×4 pixels of the narrow band light sensor 12 disposed for respective four PDs 35 being plural, e.g., 2×2 pixels of the visible light sensor 11.

Similar to that in FIG. 12, the narrow band filters 42 disposed for respective 16 PDs 47 being 4×4 pixels of the narrow band light sensor 12 may be filters having pass bands being mutually different narrow bands, or two of narrow band filters 42 may be filters having a pass band being the same narrow band.

In the image sensor 2 in FIG. 13, the light passing through four PDs 35 being 2×2 pixels of the visible light sensor 11 becomes the narrow band light via the narrow band filter 42, is received at respective 16 PDs 47 being 4×4 pixels of the narrow band light sensor 12 disposed for four PDs 35 being 2×2 pixels of the visible light sensor 11, and is photoelectrically converted.

As described above, in the image sensor 2 in FIG. 13, as 16 PDs 47 being 4×4 pixels of the narrow band light sensor 12 are disposed for four PDs 35 being 2×2 pixels of the visible light sensor 11, multispectral data can be acquired as the narrow band image corresponding to the narrow band light of 16 types of narrow bands at most.

Here, in the image sensor 2 in FIG. 13, 2×2 pixels of the visible light sensor 11 for 4×4 pixels of the narrow band light sensor 12 are two G pixels that receive light permeated through the green color filter (hereinafter also referred to as G filter), one R pixel that receives light permeated through a red color filter (hereinafter also referred to as R filter), and one B pixel that receive light permeated through a blue color filter (hereinafter also referred to as B filter) of the visible light sensor 11.

Accordingly, in the image sensor 2 in FIG. 13, the light permeated through the respective PDs 35 being two G pixels, one R pixel and one B pixel is permeated collectively, in a manner of speaking, through the narrow band filters 42, and the resultant narrow band light is received at 4×4 pixels of the narrow band light sensor 12.

Accordingly, in the narrow band light sensor 12, based on a bundle of the light permeated through respective of the R pixel, the G pixel and the B pixel of the visible light sensor 11, the narrow band light that permeates through the narrow band filters 42 may be selected and received from the bundle of light.

<Fifth Configuration Example of Image Sensor 2>

Figure 14:
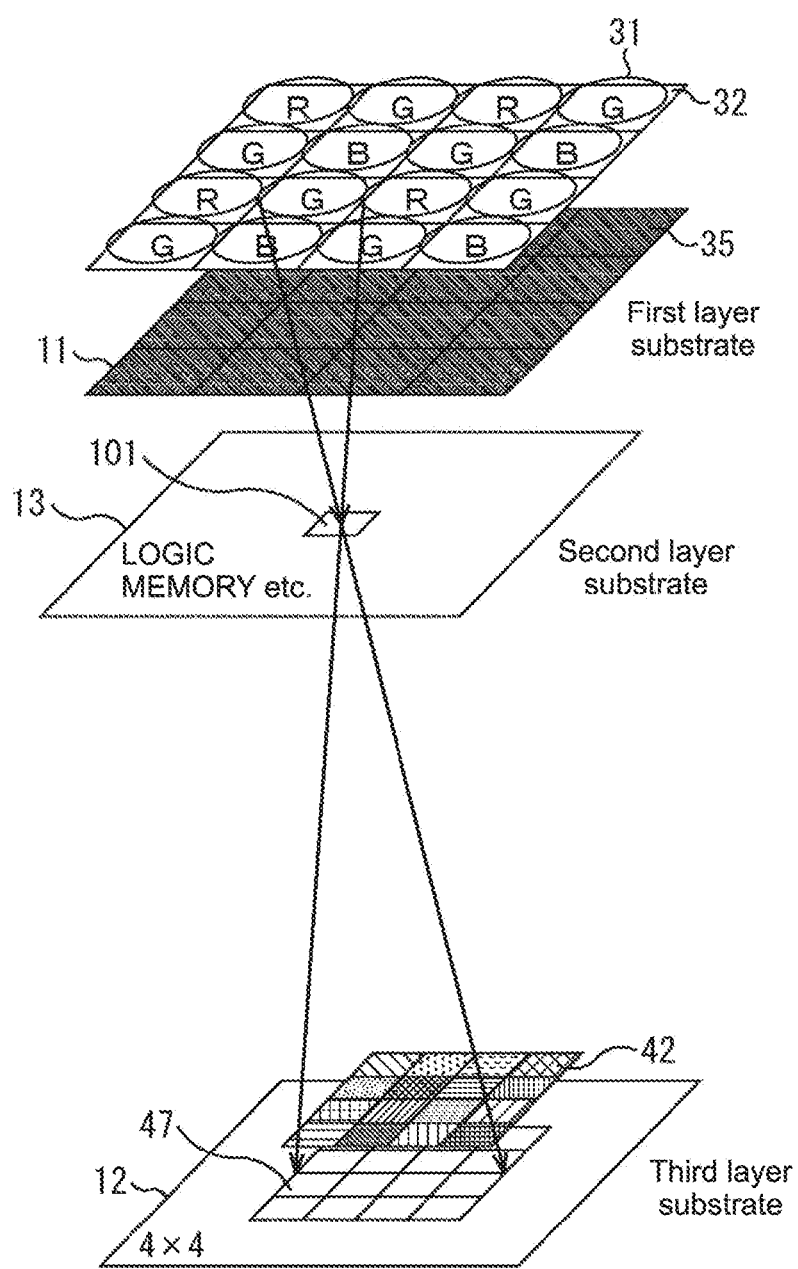
FIG. 14 is a schematic perspective view showing a fifth configuration example of the image sensor 2.

FIG. 14 is a schematic perspective view showing a fifth configuration example of the image sensor 2.

Note that, in the drawing, components corresponding to those in FIG. 6 are denoted by the same reference numerals, and thus detailed description thereof will be hereinafter omitted.

In FIG. 14, the image sensor 2 is configured by laminating three from the first layer substrate to the third layer substrate, similar to FIG. 6.

Although the first layer substrate is the visible light sensor 11, the second layer substrate is the narrow band light sensor 12, and the third layer substrate is circuit board 13, respectively, in FIG. 6, the first layer substrate is the visible light sensor 11, the second layer is the circuit board 13, and the third layer substrate is the narrow band light sensor 12, respectively, in FIG. 14.

In the fifth configuration example of the image sensor 2 in FIG. 14, 16 PDs 47 being plural 4×4 pixels of the narrow band light sensor 12 are disposed for one PD 35 being one pixel of the visible light sensor 11.

Thus, the light permeated through one PD 35 being one pixel of the visible light sensor 11 is received at 16 PDs 47 being 4×4 pixels of the narrow band light sensor 12 disposed for the one pixel.

Also in FIG. 14, similar to FIG. 13, individual narrow band filters 42 are disposed for respective 16 PDs 47 being 4×4 pixels of the narrow band light sensor 12 disposed for one PD 35 being one pixel of the visible light sensor 11.

In the image sensor 2 in FIG. 14, the light passing through one PD 35 being one pixel of the visible light sensor 11 becomes the narrow band light via the narrow band filter 42, is received at respective 16 PDs 47 being 4×4 pixels of the narrow band light sensor 12 disposed for one PD 35 being on pixel of the visible light sensor 11, and is photoelectrically converted.

Here, in FIG. 14, the light permeated through one PD 35 being one pixel of the visible light sensor 11 permeates through the circuit board 13, and then is received at 16 PDs 47 being 4×4 pixels of the narrow band light sensor 12 via the narrow band filter 42.

The circuit board 13 is configured, for example, of Si. An intersection of the circuit board 13 configured of Si and an optical path of the light permeated though one PD 35 being one pixel of the visible light sensor 11 and received at 16 PDs being 4×4 of the narrow band light sensor 12 is configured of the transparent material 101, for example, $SiO_2$.

Accordingly, the light passing through one PD 35 being one pixel of the visible light sensor 11 permeates the transparent material 101, $SiO_2$, when permeating the circuit board 13, and therefore permeates the circuit board 13 without (almost not) attenuating to be received by the narrow band light sensor 12.

In FIG. 14, the narrow band sensor 12 receives light (narrow band light) permeated through Si configuring the PD 35 being the pixel of the visible light sensor 11 and the transparent material 101, $SiO_2$, of the circuit board 13. Therefore, in FIG. 14, the Si layer through which the light received by the narrow band light sensor 12 is one layer of Si configuring the PD 35 being the pixel of the visible light sensor 11.

In the image sensor 2 in FIG. 14, as 16 PDs 47 being 4×4 pixels of the narrow band light sensor 12 are disposed for one PD 35 being one pixel of the visible light sensor 11, multispectral data can be acquired as the narrow band image corresponding to the narrow band light of 16 types of narrow bands at most.

Here, in the image sensor 2 in FIG. 14, one pixel of the visible light sensor 11 for 4×4 pixels of the narrow band light sensor 12 is one G pixel that receives light permeated through the green color filter of the visible light sensor 11.

Accordingly, in the image sensor 2 in FIG. 14, the PDs 47 of the narrow band light sensor 12 receives the light permeated through the G pixel, i.e., the light permeated through the green color filter (furthermore the narrow band light permeated through Si configuring the PD 35 being the pixel of the visible light sensor 11 and the narrow band light permeated through the narrow band filter 42).

<Sixth Configuration Example of Image Sensor 2>

Figure 15:
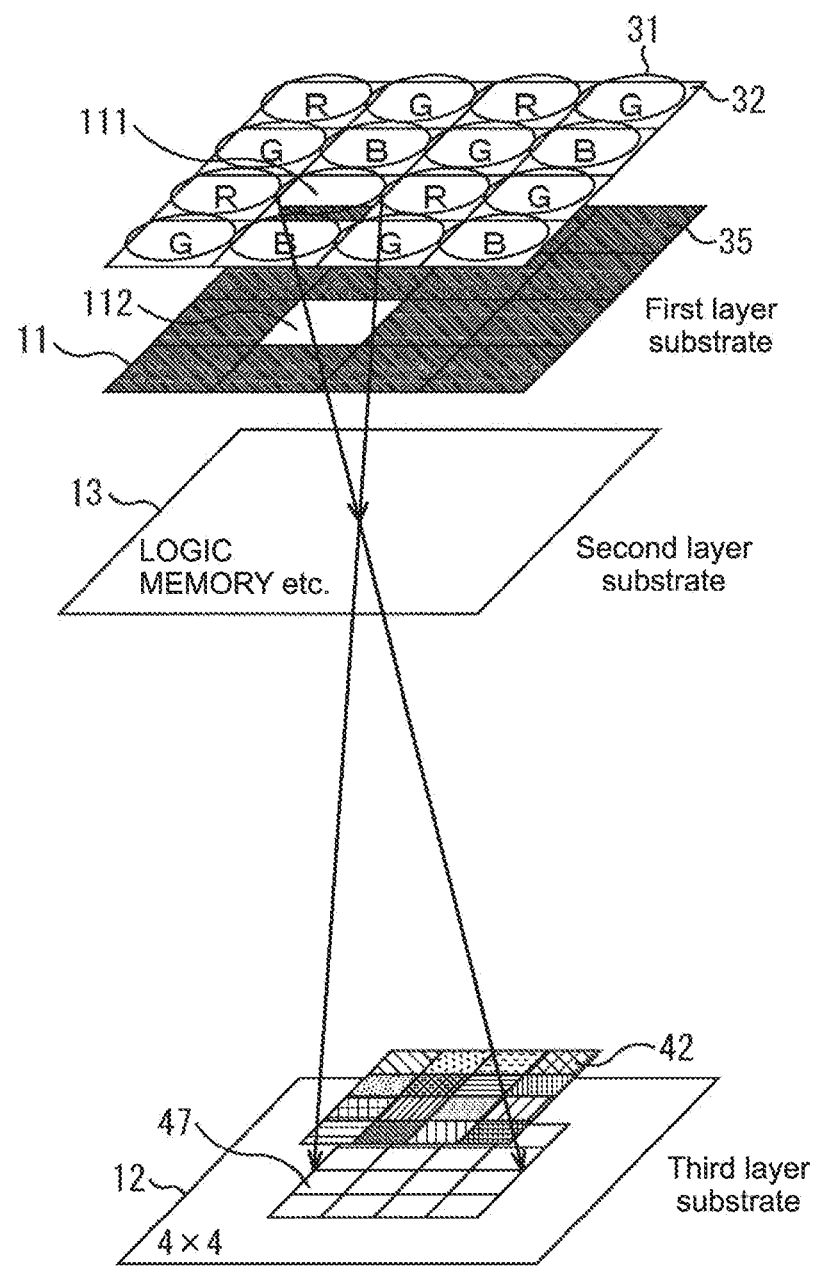
FIG. 15 is a schematic perspective view showing a sixth configuration example of the image sensor 2.

FIG. 15 is a schematic perspective view showing a sixth configuration example of the image sensor 2.

Note that, in the drawing, components corresponding to those in FIG. 14 are denoted by the same reference numerals, and thus detailed description thereof will be hereinafter omitted.

In the image sensor 2 in FIG. 15, the first layer substrate is the visible light sensor 11, the second layer substrate is the circuit board 13, and the third layer substrate is the narrow band light sensor 12, respectively, similar to FIG. 14.

Also, in the image sensor 2 of the sixth configuration example in FIG. 15, similar to FIG. 14, 16 PDs 47 being plural 4×4 pixels of the narrow band light sensor 12 are disposed for one pixel of the visible light sensor 11.

However, in FIG. 15, one pixel of the visible light sensor 11 for 16 PDs 47 being 4×4 pixels of the narrow band light sensor 12 is not the PD 35, but is a transparent material 112, for example, $SiO_2$.

Furthermore, the color filter for one pixel of the visible light sensor 11 being the transparent material 112, $SiO_2$, is not any of the R filter, the G filter, the B filter configuring the Bayer array, and is a color filter for permeating white light (hereinafter also referred to as a W (White) filter) 111.

In other words, in FIG. 15, the color filter for one pixel of the visible light sensor 11 for 16 PDs 47 being 4×4 pixels of the narrow band light sensor is originally the G filter of the Bayer array, but the G filter is worked to the W filter 111.

Also, in FIG. 14, an intersection of the circuit board 13 and an optical path of the light (shown by arrows in the drawing) received by narrow band light sensor 12 is configured of the transparent material 101, $SiO_2$, but, in FIG. 15, it is not configured of the transparent material 101, $SiO_2$, but of Si.

In the image sensor 2 in FIG. 15 configured as above, the light permeated through the R filter, the G filter or the B filter of the OCCF 32 is received at the PD 35 being the pixel of the visible light sensor 11.

Also, the light permeated through the W filter 111 of the OCCF 32 permeates the transparent material 112, $SiO_2$, being the pixel of the visible light sensor 11, and is incident on the circuit board 13.

The light incident on the circuit board 13 permeates Si configuring the circuit board 13, becomes the narrow band light via the narrow band filter 42, and is received by respective 16 PDs 47 being 4×4 pixels of the narrow band light sensor 12.

In the image sensor 2 in FIG. 15, as 16 PDs 47 being 4×4 pixels of the narrow band light sensor 12 are disposed for the transparent material 112, $SiO_2$ being one pixel of the visible light sensor 11 similar to FIG. 14, multispectral data can be acquired as the narrow band image corresponding to the narrow band light of 16 types of narrow bands at most.

In FIG. 15, the narrow band sensor 12 receives light (narrow band light) permeated through the transparent material 112, $SiO_2$, of the visible light sensor 11 and Si configuring the circuit board 13. Therefore, in FIG. 15, the Si layer through which the light received by the narrow band light sensor 12 is one layer of Si configuring the circuit board 13.

Also, in the image sensor 2 in FIG. 15, the transparent material 112, $SiO_2$, being one pixel of the visible light sensor 11 for 4×4 pixels of the narrow band light sensor 12 permeates the light permeated through the W filter 111 of the OCCF 32.

Accordingly, in the image sensor 2 in FIG. 15, the PDs 47 of the narrow band light sensor 12 receives the light permeated through the W filter 111 (furthermore the narrow band light permeated through the transparent material 112, $SiO_2$, being the pixel of the visible light sensor 11, Si configuring the circuit board 13 and the narrow band light permeated through the narrow band filter 42).

<Seventh Configuration Example of Image Sensor 2>

Figure 16:
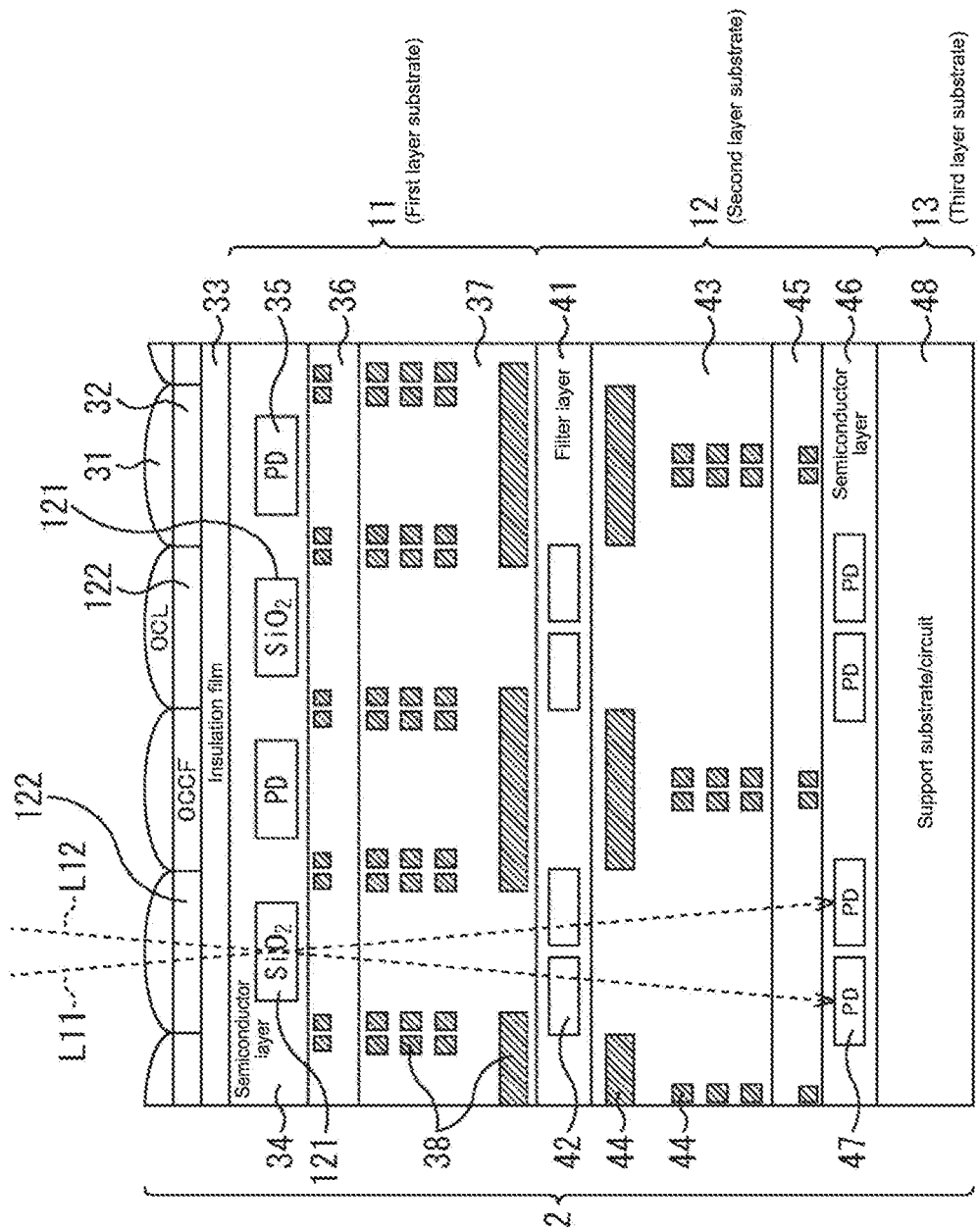
FIG. 16 is a cross-sectional view showing a seventh configuration example of the image sensor 2.

FIG. 16 is a cross-sectional view showing a seventh configuration example of the image sensor 2.

Note that, in the drawing, components corresponding to those in FIG. 11 are denoted by the same reference numerals, and thus detailed description thereof will be hereinafter omitted.

In FIG. 16, in the semiconductor layer 34 of the visible light sensor 11, the PDs 35 being the pixel or the transparent materials 121, e.g., $SiO_2$, having high permeability are formed. In other words, in the semiconductor layer 34, parts of the pixels of the visible light sensor 11 corresponding to the PDs 47 being the pixels of the narrow band sensor 12 are opening, and the openings are filled with the transparent material 121, $SiO_2$.

Furthermore, in FIG. 16, parts of the OCCFs 32 corresponding to the transparent material 121, $SiO_2$, being the pixels of the visible light sensor 11 becomes W filters 122 in place of the color filters of the original colors in the Bayer array.

In the image sensor 2 in FIG. 16 configured as above, the light permeated through the R filter, the G filter or the B filter of the OCCF 32 is incident on and is received at the PD 35 being one pixel of the visible light sensor 11.

Also, light L11, L12 permeated through the W filter 122 is incident on, and is permeated through $SiO_2$ of the transparent material 121 being one pixel of the visible light sensor 11. The light L11, L12 permeated through $SiO_2$ of the transparent material 121 permeates through the narrow band filters 42, and is received at the PD 47 being the separate pixel of the narrow band light sensor 12.

Here, for example, in the image sensor 2 in FIG. 5, as the light incident on the narrow band filter 42 is, for example, permeated through Si configuring the PD 35 being one pixel of the visible light sensor 11, light having no long wavelength is absorbed by Si. As a result, the narrow band light that can be received at the PD 47 being the pixel of the narrow band light sensor 12 is limited to the range of the light having long wavelength not absorbed by Si configuring the PD 35 being one pixel of the visible light sensor 11.

On the other hand, in the image sensor 2 in FIG. 16, the light incident on the narrow band filter 42 is permeated though the W filter 122 and $SiO_2$ of the transparent material 121, for example, and there is no light absorbed by Si as shown in FIG. 5. As a result, the narrow band light that can be received at the PD 47 being the pixel of the narrow band light sensor 12 can be selected from the light incident on the narrow band filter 42, i.e., light in broadband from ultraviolet to infrared, for example.

Accordingly, it can be said that the image sensor 2 in FIG. 5 where the light incident on the narrow band filter 42 is permeated through Si is a long wavelength corresponding type image sensor that can select the narrow band light received by the narrow band light sensor 12 from the light having a long wavelength.

On the other hand, it can be said that the image sensor 2 in FIG. 16 where the light incident on the narrow band filter 42 is permeated through the W filter 122 and $SiO_2$ of the transparent material 121 is an all wavelengths corresponding type image sensor that can select the narrow band light received by the narrow band light sensor 12 from the light in broadband.

Figure 17:
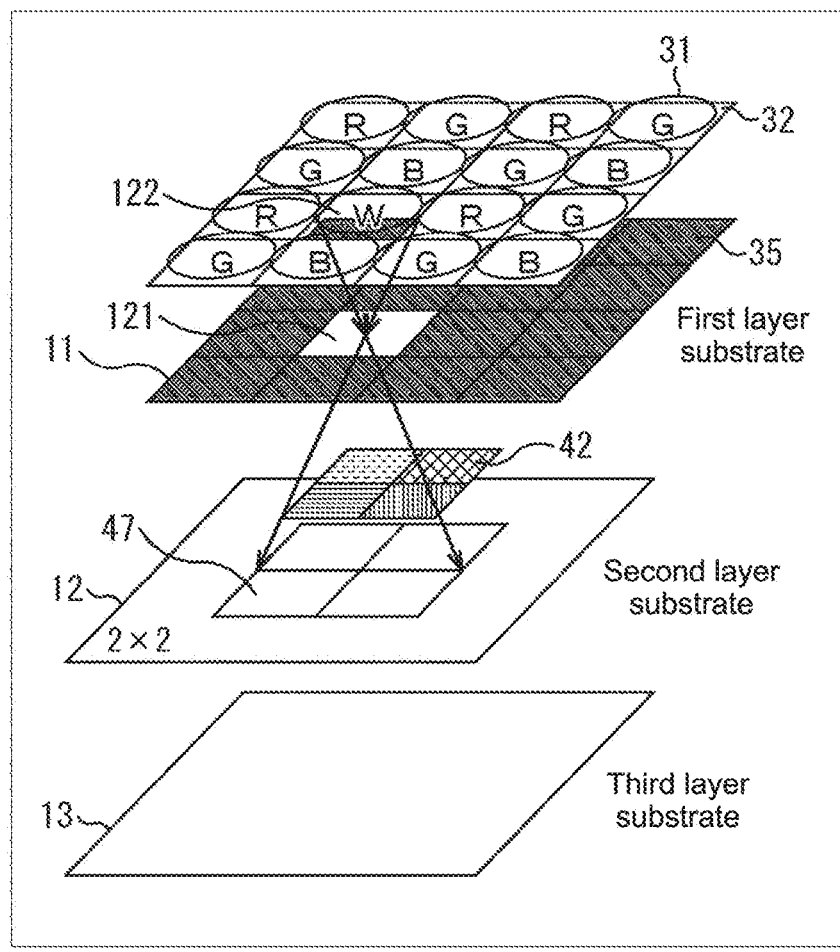
FIG. 17 is a schematic perspective view showing a seventh configuration example of the image sensor 2.

FIG. 17 is a schematic perspective view showing a seventh configuration example of the image sensor 2 in FIG. 16.

Note that, in the drawing, components corresponding to those in FIG. 12 are denoted by the same reference numerals, and thus detailed description thereof will be hereinafter omitted.

In the seventh configuration example of the image sensor 2, a part of the pixels of the visible light sensor 11 is not the PDs 35, but $SiO_2$ of the transparent material 121, and the color filter of the OCCF 32 in the Bayer array for the pixels is not the color filter of the original colors in the Bayer array, but the W filter 122.

Two PDs 47 being two pixels of the narrow band light sensor 12 are disposed for $SiO_2$ of the transparent material 121 being one pixel of the visible light sensor 11 in the horizontal direction and the vertical direction, respectively.

Accordingly, in the seventh configuration example of the image sensor 2, as shown in FIG. 17, four PDs 47 being 2×2 pixels of the narrow band light sensor 12 are disposed for $SiO_2$ of the transparent material 121 being one pixel of the visible light sensor 11.

Thus, the light permeated through $SiO_2$ of the transparent material 121 being one pixel of the visible light sensor 11 is received at four PDs 47 being 2×2 pixels of the narrow band light sensor 12 disposed for the one pixel.

The individual narrow band filters 42 are disposed for respective four PDs 47 being 2×2 pixels of the narrow band light sensor 12 disposed for one PD 35 being one pixel of the visible light sensor 11.

In the image sensor 2 configured as above, the PDs 35 being the pixels of the narrow band light sensor 12 receives the light permeated through the R filter, the G filter, or the B filter of the OCCF 32.

In addition, the light permeated through the W filter 122 is incident on and is permeated through $SiO_2$ of the transparent material 121 as the pixel of the visible light sensor 11. The light permeated through $SiO_2$ of the transparent material 121 becomes the narrow band light via the narrow band filter 42, and is received by respective four PDs 47 being 2×2 pixels of the narrow band light sensor 12 disposed for $SiO_2$ of the transparent material 121 being the pixel of the visible light sensor 11.

The light permeated through the W filter 122 and $SiO_2$ of the transparent material 121 has spectrum components similar to the light in broadband, i.e., the light incident on the image sensor 2. Therefore, the narrow band light sensor 12 can select the narrow band light that is permeated through the narrow band filter 42 from the light in the broadband.

<Eighth Configuration Example of Image Sensor 2>

Figure 18:
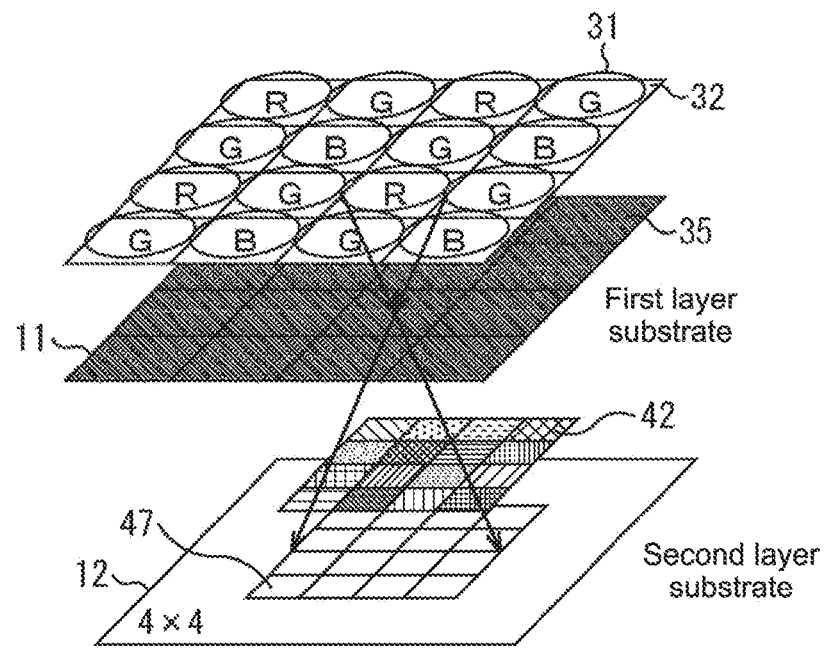
FIG. 18 is a schematic perspective view showing an eighth configuration example of the image sensor 2.

FIG. 18 is a schematic perspective view showing an eighth configuration example of the image sensor 2.

Note that, in the drawing, components corresponding to those in FIG. 13 are denoted by the same reference numerals, and thus detailed description thereof will be hereinafter omitted.

Also, hereinafter for simplifying the description, the visible light sensor 11 is the first layer substrate, the narrow band light sensor 12 is the second layer substrate, and the circuit board 13 is the third layer substrate. Furthermore, hereinafter, the circuit board 13 of the third layer substrate is not shown.

In the eighth configuration example of the image sensor 2, 16 PDs 47 as plural 4×4 pixels of the narrow band light sensor 12 are disposed for one PD 35 being the R pixel of the visible light sensor 11.

Thus, the light permeated through one PD 35 being the R pixel of the visible light sensor 11 is received at 16 PDs 47 being 4×4 pixels of the narrow band light sensor 12 disposed for the R pixel.

The individual narrow band filters 42 are disposed for respective 16 PDs 47 being 4×4 pixels of the narrow band light sensor 12 disposed for one PD 35 being the R pixel of the visible light sensor 11.

In the image sensor 2 in FIG. 18, the light passing through one PD 35 being the R pixel of the visible light sensor 11 becomes the narrow band light via the narrow band filter 42, received at respective 16 PDs 47 being 4×4 pixels of the narrow band light sensor 12 disposed for one PD 35 being the R pixel of the visible light sensor 11.

As described above, in the image sensor 2 in FIG. 18, the light permeated through the PD 35 being the R pixel is permeated through the narrow band filter 42, and the resultant narrow band light is received at 4×4 pixels of the narrow band light sensor 12.

Accordingly, the narrow band light sensor 12, based on the light permeated through the PD 35 being the R pixel of the visible light sensor 11, the narrow band light that permeates through the narrow band filters 42 may be selected and received from the light.

Here, in the eighth configuration example of the image sensor 2 in FIG. 18, the narrow band light sensor 12 receives the light permeated through the PD 35 being the R pixel of the visible light sensor 11, i.e., the narrow band light permeated through the narrow band filter 42 of the light permeated through the R filter of the OCCF 32.

Accordingly, in the image sensor 2 in FIG. 18, as the narrow band light received by the narrow band light sensor 12 can be selected from the light permeated through the R filter of the OCCF 32, it is effective to the case that the narrow band light within the light, for example, from the light having a wavelength of about 600 nm or more to infrared region is received.

Also, for example, in the first configuration example of the image sensor 2 in FIG. 6, as described above, the narrow band light sensor 12 receives the light permeated through the PD 35 being the G pixel of the visible light sensor 11, i.e., the light permeated through the narrow band filter 42 from the light permeated through the G filter of the OCCF 32.

Accordingly, in the image sensor 2 in FIG. 6, as the narrow band light received by the narrow band light sensor 12 can be selected from the light permeated though the G filter of the OCCF 32, it is effective when the narrow band light for detecting the detection items shown in FIG. 7, for example, chlorophyll, beta-carotene, and hemoglobin.

Similar to the image sensor 2 in FIG. 6 or FIG. 18, the narrow band light sensor 12 can configure an image sensor that receives the narrow band light permeated through the narrow band filter 42 from the light permeated through the PD 35 being the B pixel of the visible light sensor 11 (hereinafter referred to as "B pixel object sensor").

However, in the B pixel object sensor, the light permeated though the PD 35 being the B pixel of the visible light sensor 11 permeates the B filter of the OCCF 32 before being incident on the PD 35 being the B pixel, and therefore includes (almost) no long wavelength that can permeate Si configuring the PD 35 being the B pixel.

Accordingly, in the B pixel object sensor, there is almost no light that permeates Si configuring the PD 35, and, in the narrow band light sensor 12, it is therefore difficult to receive the light having sufficient intensity.

<Ninth Configuration Example of Image Sensor 2>

Figure 19:
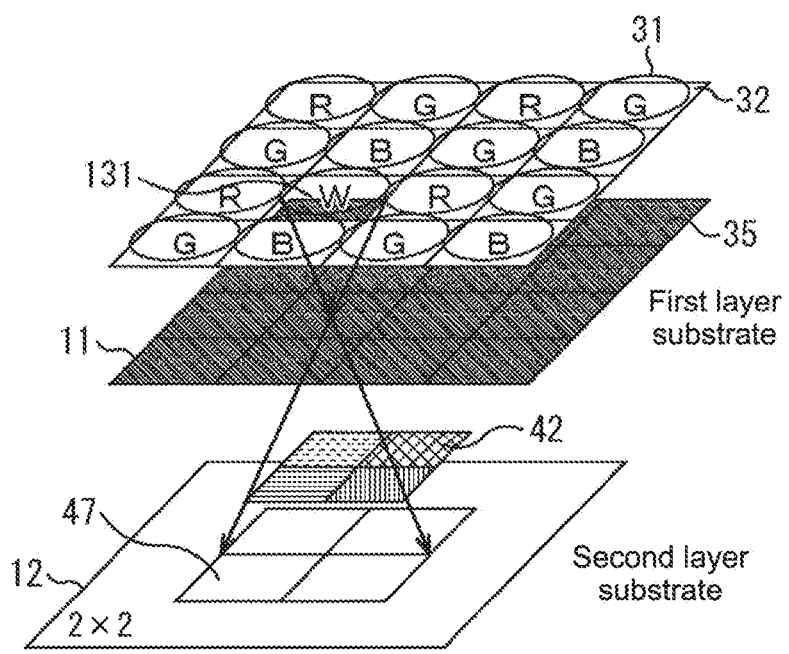
FIG. 19 is a schematic perspective view showing a ninth configuration example of the image sensor 2.

FIG. 19 is a schematic perspective view showing a ninth configuration example of the image sensor 2.

Note that, in the drawing, components corresponding to those in FIG. 17 are denoted by the same reference numerals, and thus detailed description thereof will be hereinafter omitted.

In the ninth configuration example of the image sensor 2, a part of the color filter of the OCCF 32 in the Bayer array is not the color filter of the original colors in the Bayer array, but the W filter 131.

Then, four PDs 47 being 2×2 pixels of the narrow band light sensor 12 are disposed for the pixel for the W filter 131 of the visible light sensor 11, i.e., the PD 35 being the W pixel that receives the light permeated through the W filter 131.

Thus, the light permeated through the PD 35 being the W pixel of the visible light sensor 11 is received at four PDs 47 being 2×2 pixels of the narrow band light sensor 12 disposed for the W pixel.

The individual narrow band filters 42 are disposed for respective four PDs 47 being 2×2 pixels of the narrow band light sensor 12 disposed for the PD 35 being the W pixel of the visible light sensor 11.

In the image sensor 2 in FIG. 19 configured as above, the light permeated through the R filter, the G filter or the B filter of the OCCF 32 is incident on and received at the PD 35 being the R pixel, the G pixel or the B pixel of the visible light sensor 11.

Also, the light permeated through the W filter 131 is incident on and received at the PD 35 being the W pixel of the visible light sensor 11.

Also, a part of the light permeated through the W filter 131 is permeated through the PD 35 being the W pixel of the visible light sensor 11. The light permeated through (Si configuring) the PD 35 being the W pixel of the visible light sensor 11 becomes the narrow band light via the narrow band filter 42, and is received by respective four PDs 47 being 2×2 pixels of the narrow band light sensor 12 disposed for the PD 35 being the W pixel of the visible light sensor 11.

As above, in the image sensor 2 in FIG. 19, the light permeated through the W filter 131 and Si (furthermore, the narrow band filter 42) configuring the PD 35 being the W pixel in the narrow band light sensor 12.

Accordingly, in the narrow band light sensor 12, the narrow band light with less attenuation can be received, i.e., the narrow band light can be received at high sensitivity as compared to the case that the light permeated through the R filter and the PD 35 being the R pixel, the G filter and the PD 35 being the G pixel, and the B filter and the PD 35 being the B pixel is received.

In addition, in the image sensor 2 in FIG. 19, the narrow band light received by the narrow band light sensor 12 can be selected from the light permeated through the W filter 131 and Si configuring the PD 35. Therefore, though depending on the thickness of Si configuring the PD 35 being the W pixel, it is effective, for example, for receiving the narrow band light having a wavelength of about 550 nm to infrared region.

<Tenth Configuration Example of Image Sensor 2>

Figure 20:
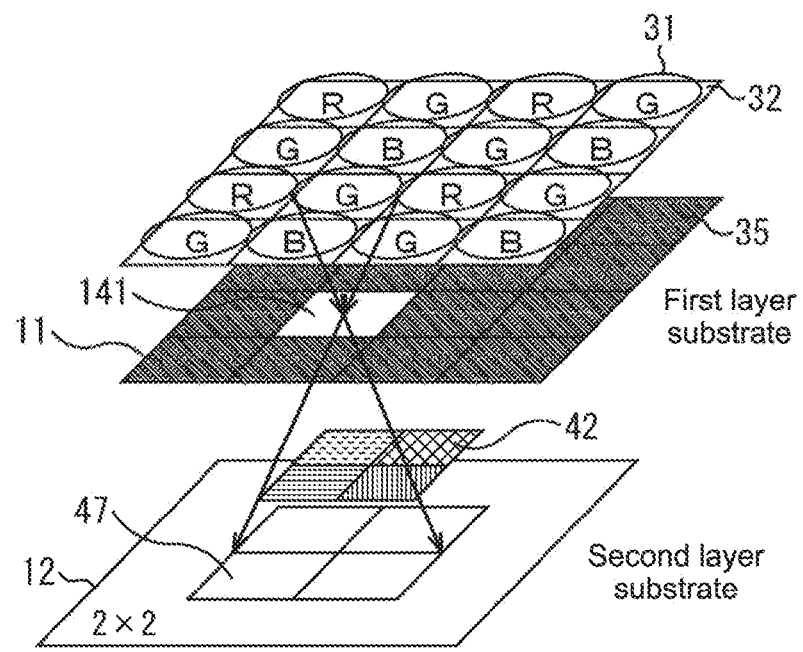
FIG. 20 is a schematic perspective view showing a tenth configuration example of the image sensor 2.

FIG. 20 is a schematic perspective view showing a tenth configuration example of the image sensor 2.

Note that, in the drawing, components corresponding to those in FIG. 17 are denoted by the same reference numerals, and thus detailed description thereof will be hereinafter omitted.

In the tenth configuration example of the image sensor 2, a part of the pixels of the visible light sensor 11 is not the PD 35, but the transparent material 141, for example, $SiO_2$. In FIG. 20, the pixel (G pixel) of the OCCF 32 in the Bayer array to a part of the G filter is the transparent material 141.

Four PDs 47 being 2×2 pixels of the narrow band light sensor 12 are disposed for $SiO_2$ of the transparent material 141 being one pixel of the visible light sensor 11.

Thus, the light permeated through $SiO_2$ of the transparent material 141 being the pixel of the visible light sensor 11 is received by four PDs 47 being 2×2 pixels of the narrow band light sensor 12.

The individual narrow band filters 42 are disposed for respective four PDs 47 being 2×2 pixels of the narrow band light sensor 12 disposed for the PD 35 being the pixel of the visible light sensor 11.

In the image sensor 2 in FIG. 20 configured as above, the light permeated though the R filter, the G filter or the B filter of the OCCF 32 is incident on and received at the PD 35 being the pixel of the visible light sensor 11.

Also, the light permeated through the G filter to the pixel is incident on and permeated thorough $SiO_2$ of the transparent material 141 being the pixel of the visible light sensor 11. The light permeated though $SiO_2$ of the transparent material 141 becomes the narrow band light via the narrow band filter 42, and is received at respective four PDs 47 being 2×2 pixels of the narrow band light sensor 12 disposed for $SiO_2$ of the transparent material 141 being the pixel of the visible light sensor 11.

Accordingly, in the image sensor 2 in FIG. 20, as the narrow band light received by the narrow band light sensor 12 can be selected from the light permeated though the G filter of the OCCF 32, it is effective when the narrow band light for detecting the detection items shown in FIG. 7, for example, chlorophyll, beta-carotene, and hemoglobin.

Furthermore, the narrow band light received by the narrow band light sensor 12 is the light permeated through $SiO_2$ of the transparent material 141 being the pixel of the visible light sensor 11 after permeating through the G filter. Therefore, the narrow band light can be received at high sensitivity as the light is not absorbed by Si as compared to the case that the light permeated through Si configuring the PD 35 being the pixel of the light sensor 11 is received by the narrow band light sensor 12 after permeating through the G filter in FIG. 2.

<Eleventh Configuration Example of Image Sensor 2>

Figure 21:
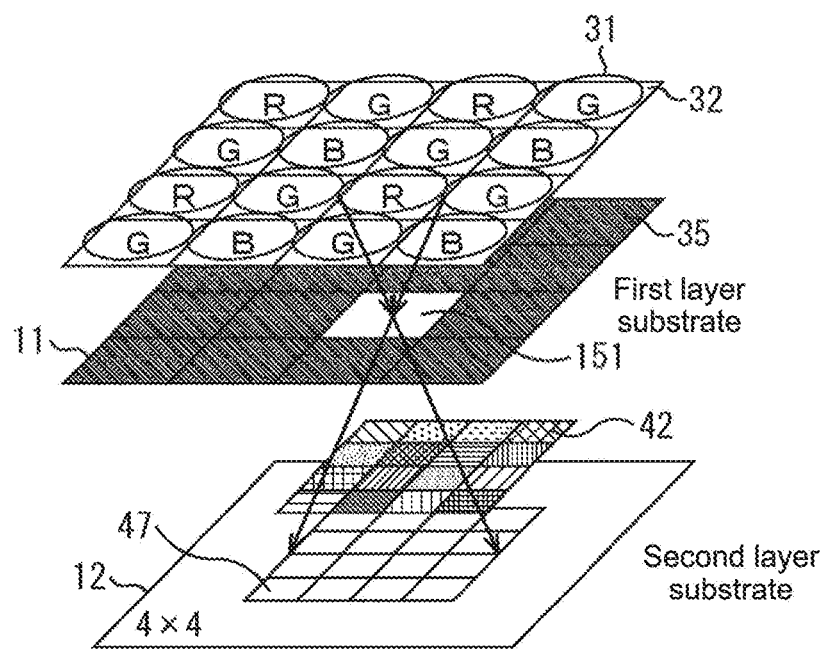
FIG. 21 is a schematic perspective view showing an eleventh configuration example of the image sensor 2.

FIG. 21 is a schematic perspective view showing an eleventh configuration example of the image sensor 2.

Note that, in the drawing, components corresponding to those in FIG. 20 are denoted by the same reference numerals, and thus detailed description thereof will be hereinafter omitted.

In the eleventh configuration example of the image sensor 2, a part of the visible light sensor 11 is not the PD 35, but $SiO_2$ of the transparent material 151, for example. In FIG. 21, the pixel (R pixel) to a part of the R filter, for example, of the OCCF 32 in the Bayer array, is the transparent material 151.

16 PDs 47 being 4×4 pixels of the narrow band light sensor 12 are disposed for $SiO_2$ of the transparent material 151 being one pixel of the visible light sensor 11.

Thus, the light permeated through $SiO_2$ of the material 151 being the pixel of the visible light sensor 11 is received at 16 PDs 47 being 4×4 pixels of the narrow band light sensor 12 disposed for the R pixel.

The individual narrow band filters 42 are disposed for respective 16 PDs 47 being 4×4 pixels of the narrow band light sensor 12 disposed for $SiO_2$ of the transparent material 151 being the pixel of the visible light sensor 11.

In the image sensor 2 in FIG. 21 configured as above, the PDs 35 being the pixels of the narrow band light sensor 12 receives the light permeated through the R filter, the G filter, or the B filter of the OCCF 32.

In addition, in $SiO_2$ of the transparent material 151 being the pixel of the visible light sensor 11, the light permeated through the R filter to the pixel is incident on and is permeated. The light permeated through $SiO_2$ of the transparent material 151 becomes the narrow band light via the narrow band filter 42, and is received by respective four PDs 47 being 4×4 pixels of the narrow band light sensor 12 disposed for $SiO_2$ of the transparent material 151 being the pixel of the visible light sensor 11.

Accordingly, in the image sensor 2 in FIG. 21, as the narrow band light received by the narrow band light sensor 12 can be selected from the light permeated through the R filter of the OCCF 32, it is effective to the case that the narrow band light within the light, for example, from the light having a wavelength of about 600 nm or more to infrared region is received.

Furthermore, the narrow band light received by the narrow band light sensor 12 is the light permeated through $SiO_2$ of the transparent material 151 being the pixel of the visible light sensor 11 after permeating through the R filter. Therefore, the narrow band light can be received at high sensitivity as the light is not absorbed by Si as compared to the case that the light permeated through Si configuring the PD 35 being the pixel of the light sensor 11 is received by the narrow band light sensor 12 after permeating through the R filter in FIG. 18.

<Twelfth Configuration Example in Image Sensor 2>

Figure 22:
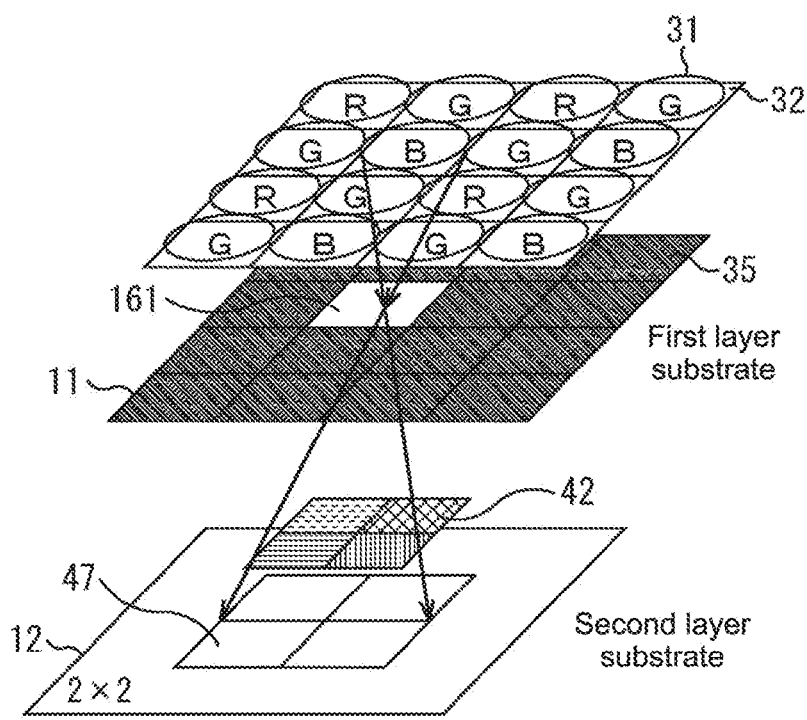
FIG. 22 is a schematic perspective view showing a twelfth configuration example of the image sensor 2.

FIG. 22 is a schematic perspective view showing a twelfth configuration example of the image sensor 2.

Note that, in the drawing, components corresponding to those in FIG. 20 are denoted by the same reference numerals, and thus detailed description thereof will be hereinafter omitted.

In the twelfth configuration example of the image sensor 2, a part of the pixels of the visible light sensor 11 is not the PD 35, but the transparent material 161, for example, $SiO_2$. In FIG. 22, the pixel (B pixel) of the OCCF 32 in the Bayer array to a part of the B filter is the transparent material 161.

Four PDs 47 being 2×2 pixels of the narrow band light sensor 12 are disposed for $SiO_2$ of the transparent material 161 being one pixel of the visible light sensor 11.

Thus, the light permeated through $SiO_2$ of the transparent material 161 being the pixel of the visible light sensor 11 is received by four PDs 47 being 2×2 pixels of the narrow band light sensor 12.

The individual narrow band filters 42 are disposed for respective four PDs 47 being 2×2 pixels of the narrow band light sensor 12 disposed for $SiO_2$ of the transparent material 161 being the pixel of the visible light sensor 11.

In the image sensor 2 in FIG. 22 configured as above, the light permeated though the R filter, the G filter or the B filter of the OCCF 32 is incident on and received at the PD 35 being the pixel of the visible light sensor 11.

Also, the light permeated through the B filter to the pixel is incident on and permeated thorough $SiO_2$ of the transparent material 161 being the pixel of the visible light sensor 11. The light permeated though $SiO_2$ of the transparent material 161 becomes the narrow band light via the narrow band filter 42, and is received at respective four PDs 47 being 2×2 pixels of the narrow band light sensor 12 disposed for $SiO_2$ of the transparent material 161 being the pixel of the visible light sensor 11.

Accordingly, in the image sensor 2 in FIG. 22, as the narrow band light received by the narrow band light sensor 12 can be selected from the light permeated though the B filter of the OCCF 32, it is effective when the narrow band light for detecting (observing) the detection items shown in FIG. 7, for example, beta-carotene, chlorophyll, an outer skin of a human skin, and pores.

<Thirteenth Configuration Example of Image Sensor 2>

Figure 23:
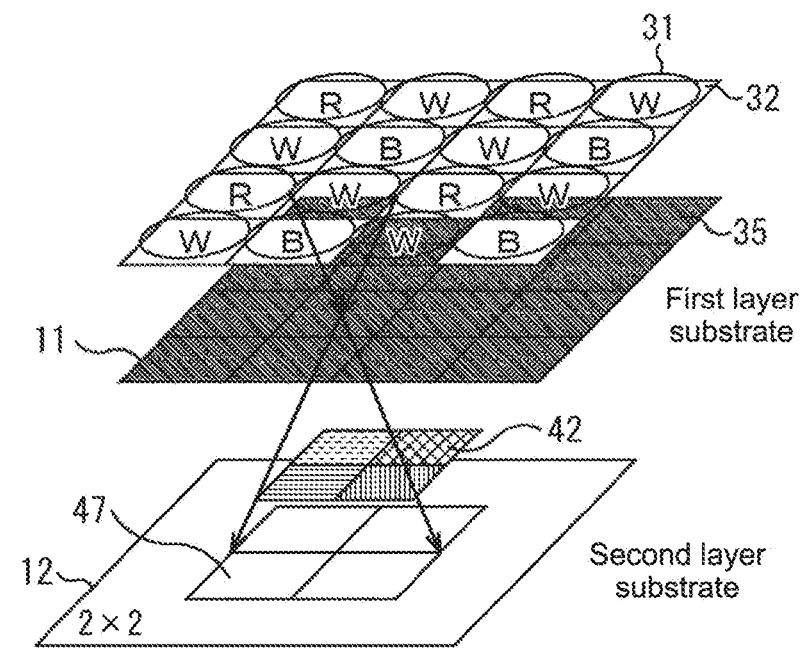
FIG. 23 is a schematic perspective view showing a thirteenth configuration example of the image sensor 2.

FIG. 23 is a schematic perspective view showing a thirteenth configuration example of the image sensor 2.

Note that, in the drawing, components corresponding to those in FIG. 19 are denoted by the same reference numerals, and thus detailed description thereof will be hereinafter omitted.

The image sensor 2 in FIG. 23 is configured similar to the image sensor 2 in FIG. 19.

Note that the image sensor 2 in FIG. 19, as described above, the OCCF 32 in the Bayer array is adopted. A part of the color filter of the OCCF 32 in the Bayer array is not the color filter of the original colors in the Bayer array, but the W filter.

In contrast, in the image sensor 2 in FIG. 23, the OCCF 32 in the array having the W filter is originally adopted.

Accordingly, in the image sensor 2 in FIG. 19, it is necessary to work a part of the OCCF 32 in the Bayer array to change into the W filter. In the image sensor 2 in FIG. 23, as the OCCF 32 in the array having the W filter is originally adopted, it is not necessary to work the OCCF 32.

In the image sensor 2 in FIG. 23, four PDs 47 being 2×2 pixels of the narrow band light sensor 12 are disposed to the pixel to the W filter, i.e., the PD 35 being the W pixel that receives the light permeated through the W filter of the visible light sensor 11.

The individual narrow band filters 42 are disposed for respective four PDs 47 being 2×2 pixels of the narrow band light sensor 12 disposed for the PD 35 being the W pixel of the visible light sensor 11.

In the image sensor 2 in FIG. 23 configured as above, the light permeated through the R filter, the G filter, the B filter or the W filter of the OCCF 32 is incident on and received at the PD 35 being the R pixel, the G pixel, the B pixel or the W pixel of the visible light sensor 11.

Also, a part of the light permeated through the W filter is permeated through the PD 35 being the W pixel of (a part or all of) the visible light sensor 11. The light permeated through (Si configuring) the PD 35 being the W pixel of the visible light sensor 11 becomes the narrow band light via the narrow band filter 42, and is received by respective four PDs 47 being 2×2 pixels of the narrow band light sensor 12 disposed for the PD 35 being the W pixel of the visible light sensor 11.

In the image sensor 2 in FIG. 23, the narrow band light acquired from the light permeated through the W filter is received in the narrow band light sensor 12. As compared to the case that the narrow band light acquired from the light permeated through the R filter, the G filter, or the B filter is received, the narrow band light received at the narrow band light sensor 12 can be selected from the light in the broadband.

Furthermore, in the image sensor 2 in FIG. 23, the visible light sensor 11 has the PD 35 that receives the light permeated through the W filter. Therefore, for example, as compared to the image sensor 2 in FIG. 17 where $SiO_2$ of the transparent material 121 is disposed in place of the PD 35 that receives the light permeated through the W filter 122, the normal image with high image quality can be acquired.

As above, in the image sensor 2 in FIG. 23 that adopts the OCCF 32 in the array having the W filter, the narrow band light that is received at the narrow band light sensor 12 can be selected from the light in the broadband, and the normal image having high image quality can be acquired. Therefore, the OCCF 32 in the array having the W filter is matched (compatible) with the image sensor 2 where the visible light sensor 11 and the narrow band light sensor 12 are laminated.

Figure 24:
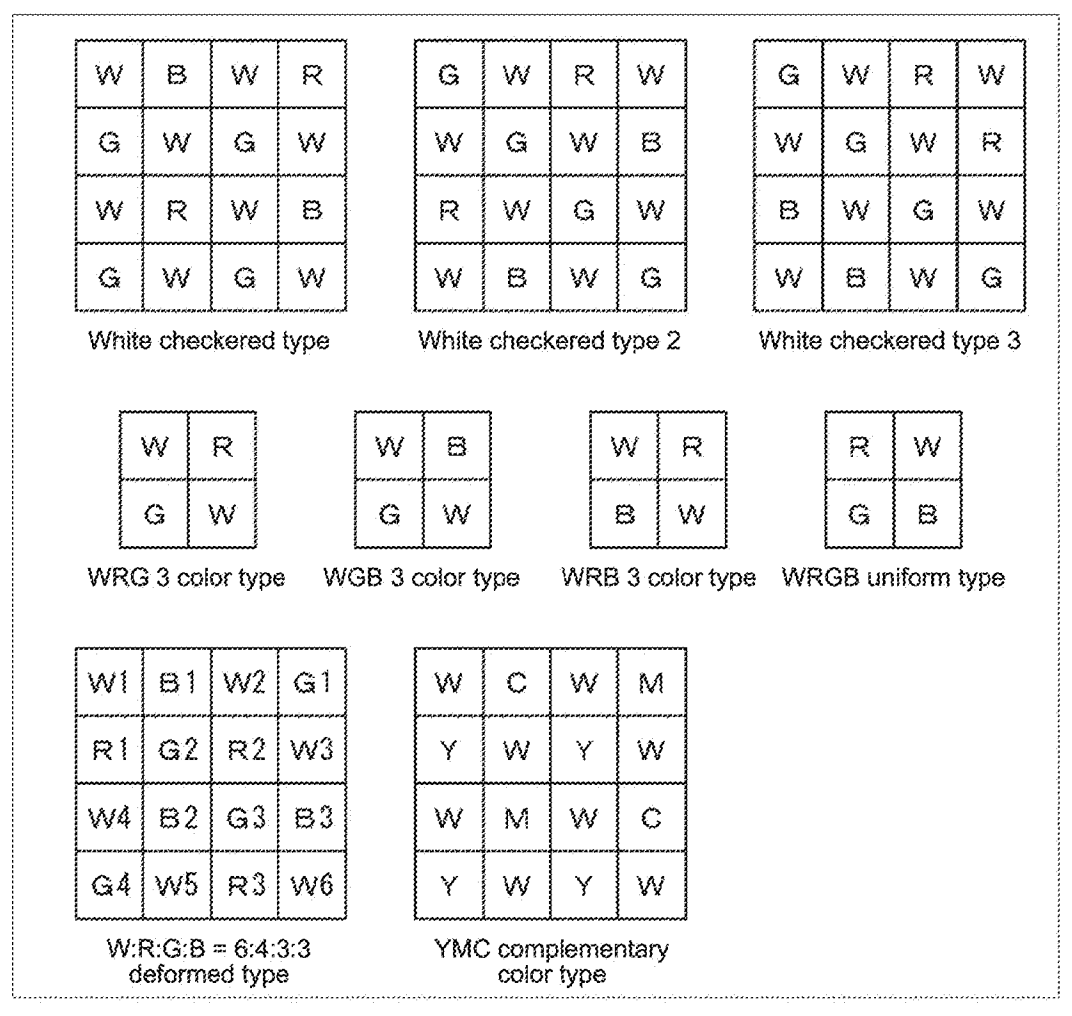

FIG. 24 is a diagram showing an example of a known array (CFA (Color filter Array) of the OCCF having the W filter.

As the OCCF 32, any other OCCF in a certain array having the W filter as well as the OCCF in the array having the W filter shown in FIG. 24 can be adopted.

<Fourteenth Configuration Example of Image Sensor 2>

Figure 25:
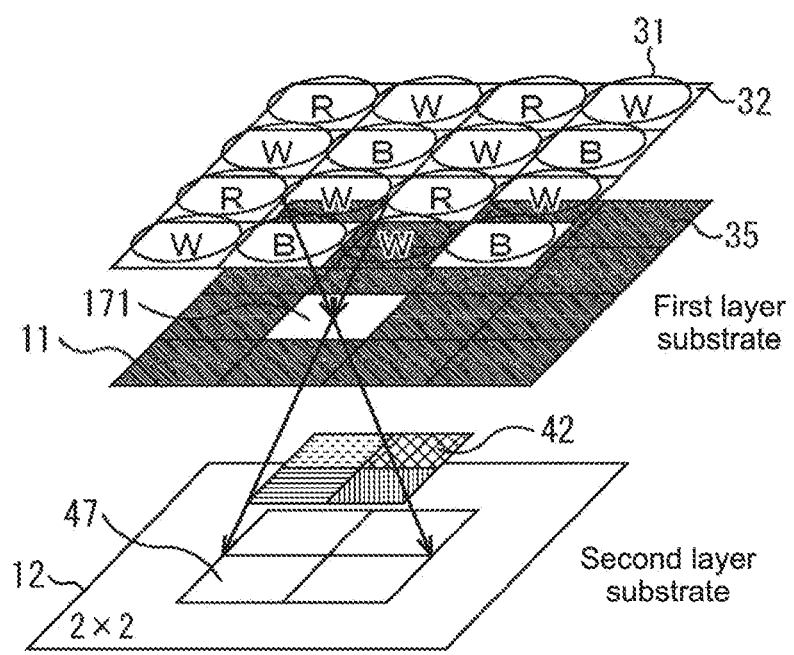
FIG. 25 is a schematic perspective view showing a fourteenth configuration example of the image sensor 2.

FIG. 25 is a schematic perspective view showing a fourteenth configuration example of the image sensor 2.

Note that, in the drawing, components corresponding to those in FIG. 17 or FIG. 23 are denoted by the same reference numerals, and thus detailed description thereof will be hereinafter omitted.

The image sensor 2 in FIG. 25 is configured similar to the image sensor 2 in FIG. 17.

Note that the image sensor 2 in FIG. 17, as described above, the OCCF 32 in the Bayer array is adopted. A part of the color filter of the OCCF 32 in the Bayer array is not the color filter of the original colors in the Bayer array, but the W filter.

In contrast, in the image sensor 2 in FIG. 25, the OCCF 32 in the array having the W filter is originally adopted similar to FIG. 23.

Accordingly, in the image sensor 2 in FIG. 17, it is necessary to work a part of the OCCF 32 in the Bayer array to the W filter. In the image sensor 2 in FIG. 25, as the OCCF 32 in the array having the W filter is originally adopted, it is not necessary to work the OCCF 32.

In the image sensor 2 in FIG. 25, similar to FIG. 17, the pixel of the visible light sensor 11 to (a part or all of) the W filter of the OCCF 32 is not the PD 35, but $SiO_2$ of the transparent material 121, and four PDs 47 being 2×2 pixels of the narrow band light sensor 12 are disposed to the transparent material 171, e.g., $SiO_2$, being the W pixel to the W filter.

In the image sensor 2 in FIG. 25 configured as above, the light permeated through the R filter, the G filter, the B filter or the W filter of the OCCF 32 is incident on and received at the PD 35 being the R pixel, the G pixel, the B pixel or the W pixel of the visible light sensor 11.

Also, the light permeated through the W filter is permeated through $SiO_2$ of the transparent material 171 being the W pixel of the visible light sensor 11. The light permeated though $SiO_2$ of the transparent material 171 becomes the narrow band light via the narrow band filter 42, and is received at respective four PDs 47 being 2×2 pixels of the narrow band light sensor 12 disposed for $SiO_2$ of the transparent material 171 being the pixel of the visible light sensor 11.

Accordingly, in the image sensor 2 in FIG. 25, the image quality of the normal image is deteriorated for $SiO_2$ of the transparent material 171 being the W pixel of the visible light sensor 11.

However, in the image sensor 2 in FIG. 25, the narrow band light sensor 12 receives not the light permeated through Si configuring the PD 35 being the pixel of the visible light sensor 11, but the narrow band light acquired from the light permeated through $SiO_2$ of the light transparent material 171. As there is no attenuation caused by permeating light through Si, the narrow band light can be received with high sensitivity.

<Fifteenth Configuration Example of Image Sensor 2>

Figure 26:
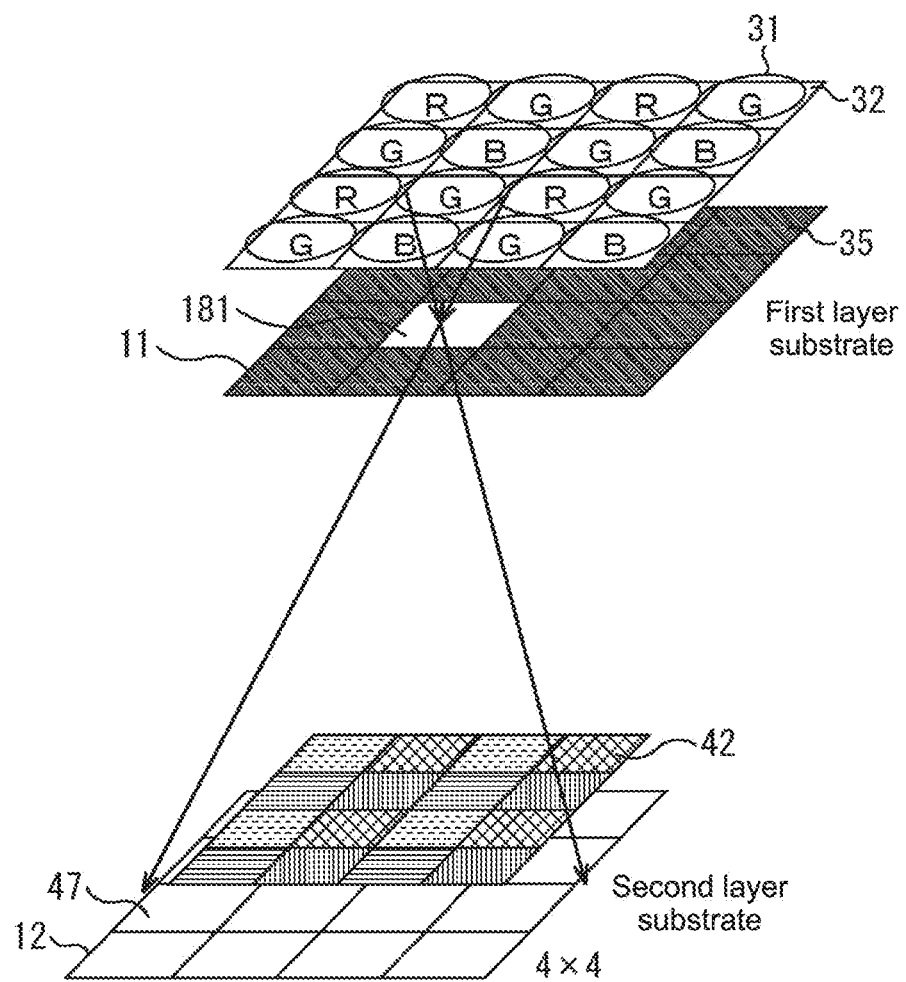
FIG. 26 is a schematic perspective view showing a fifteenth configuration example of the image sensor 2.

FIG. 26 is a schematic perspective view showing a fifteenth configuration example of the image sensor 2.

Note that, in the drawing, components corresponding to those in FIG. 20 are denoted by the same reference numerals, and thus detailed description thereof will be hereinafter omitted.

In the fifth configuration example of the image sensor 2, a part of the pixels of the visible light sensor 11 is not the PD 35, but the transparent material 181, for example, $SiO_2$. In FIG. 26, for example, similar to FIG. 20, the pixel (G pixel) of the OCCF 32 in the Bayer array to a part of the G filter is the transparent material 181.

16 PDs 47 being 4×4 pixels of the narrow band light sensor 12 are disposed for $SiO_2$ of the transparent material 181 being one pixel of the visible light sensor 11.

Thus, the light permeated through $SiO_2$ of the transparent material 181 being the pixel of the visible light sensor 11 is received by 16 PDs 47 being 4×4 pixels of the narrow band light sensor 12.

The individual narrow band filters 42 are disposed for respective 16 PDs 47 being 4×4 pixels of the narrow band light sensor 12 disposed for $SiO_2$ of the transparent material 181 being the pixel of the visible light sensor 11.

In the image sensor 2 in FIG. 26 configured as above, the light permeated though the R filter, the G filter or the B filter of the OCCF 32 is incident on and received at the PD 35 being the pixel of the visible light sensor 11.

Also, the light permeated through the G filter to the pixel is incident on and permeated thorough $SiO_2$ of the transparent material 181 being the pixel of the visible light sensor 11. The light permeated though $SiO_2$ of the transparent material 181 becomes the narrow band light via the narrow band filter 42, and is received at respective 16 PDs 47 being 4×4 pixels of the narrow band light sensor 12 disposed for $SiO_2$ of the transparent material 181 being the pixel of the visible light sensor 11.

Here, when the pixel of the visible light sensor 11 has a same size of the pixel of the narrow band light sensor 12, for example, in the image sensor 2 in FIG. 26, an area of the light received by the narrow band light sensor 12 is larger than an area of the light permeated through the visible light sensor 12.

In other words, in the image sensor 2 in FIG. 26, the light permeated through $SiO_2$ of the transparent material 181 being one pixel of the visible light sensor 11 is received at respective 16 PDs 47 being 4×4 pixels of the narrow band light sensor 12. Therefore, when the pixel of the visible light sensor 11 has the same size of the pixel of the narrow band light sensor 12, the area of the light received by the narrow band light sensor 12 will be 4×4 times (or more) of the area of the light permeated through the visible light sensor 12.

In other words, when the pixel of the visible light sensor 11 has the same size of the pixel of the narrow band light sensor 12, in order to receive the light permeated through $SiO_2$ of the transparent material 181 being one pixel of the visible light sensor 11 at respective 16 PDs 47 being 4×4 pixels of the narrow band light sensor 12, it is necessary that the area of the light received by the narrow band light sensor 12 is 4×4 times (or more) of the area of the light permeated through the visible light sensor 12.

In the image sensor 2 in FIG. 26, a distance and other positional relationship between the transparent material 181 being one pixel of the visible light sensor 11 and the PDs 47 of the narrow band light sensor 12 are set such that the area of the light received by the narrow band light sensor 12 is at least 4×4 times of the area of the light permeated through the visible light sensor 12.

When the area of the light received by the narrow band light sensor 12 is greater than the area of the light permeated through the visible light sensor 12, it will be possible to receive the light incident from a direction in (substantially) parallel with the optical axis of the image sensor 2 and the light incident from an oblique direction sloped to some degrees to the optical axis of the image sensor 2 by the narrow band light sensor 12 at the lower layer side. Thus, it is possible to receive the narrow band light with a high sensitivity.

The number of the pixels of the narrow band light sensor 12 disposed for SiO$_2$ of the transparent material 181 being one pixel of the visible light sensor 11 is not limited to 4×4 pixels, and any number may be adopted based on necessary detection items, for example.

<Sixteenth Configuration Example of Image Sensor 2>

Figure 27:
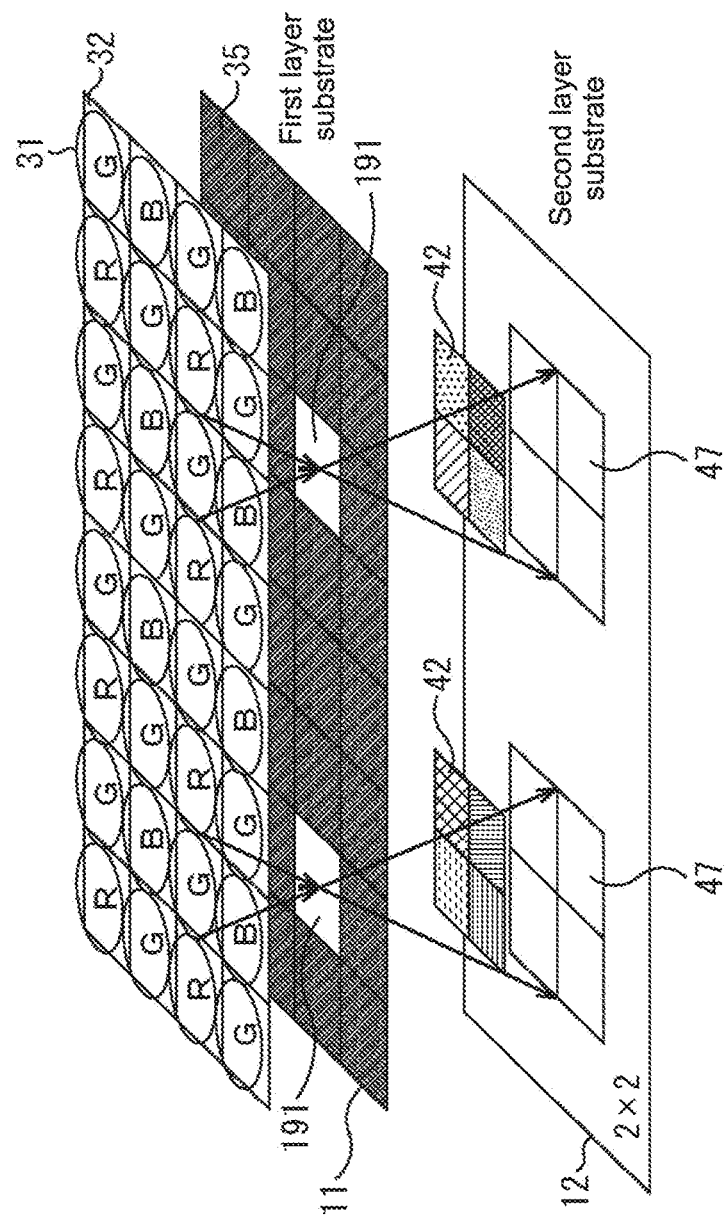
FIG. 27 is a schematic perspective view showing a sixteenth configuration example of the image sensor 2.

FIG. 27 is a schematic perspective view showing a sixteenth configuration example of the image sensor 2.

Note that, in the drawing, components corresponding to those in FIG. 20 are denoted by the same reference numerals, and thus detailed description thereof will be hereinafter omitted.

The image sensor 2 in FIG. 27 is configured similar to FIG. 20.

In other words, in the image sensor 2 in FIG. 27, a part of the G pixel of the visible light sensor 11 is not the PD 35, but the transparent material 191, e.g., SiO$_2$.

Four PDs 47 being 2×2 pixels of the narrow band light sensor 12 are disposed for SiO$_2$ of the transparent material 191 being the pixel of the visible light sensor 11, and respective individual narrow band filters 42 are disposed for respective four PDs 47 being 2×2 pixels of the narrow band light sensor 12.

In FIG. 27 (similar to FIG. 20), one G pixel of 4×4 pixels of the visible light sensor 11 is SiO$_2$ of the transparent material 191, and four PDs 47 being 2×2 pixels of the narrow band light sensor 12 are disposed for one G pixels.

Here, in the visible light sensor 11, the G pixel that is SiO$_2$ of the transparent material 191 is denoted as a G pixel 191. Bands of the narrow band light that is received by four PDs 47 being 2×2 pixels of the narrow band light sensor 12 disposed for the G pixel 191 at a certain position P and bands of the narrow band light that is received by four PDs 47 being 2×2 pixels of the narrow band light sensor 12 disposed for the G pixel 191 at other position P' may be same or different.

Specifically, four bands of the narrow band light that is received by four PDs 47 being 2×2 pixels of the narrow band light sensor 12 disposed for the G pixel 191 at the position P are represented by b1, b2, b3, b4 respectively, and four bands of the narrow band light that is received by four PDs 47 being 2×2 pixels of the narrow band light sensor 12 disposed for the G pixel 191 at the other position P' are represented by b1', b2', b3', b4' respectively, The bands b1 to b4 at the position P may be same as the bands b1' to b4' at the other position P', respectively. One or more of the bands b1 to b4 at the position P may be different from one or more of the bands b1' to b4' at the other position P', respectively.

In FIG. 27, one or more of the bands b1 to b4 at the position P are different from one or more of the bands b1' to b4' at the other position P', respectively.

Accordingly, in FIG. 27, the narrow band filters 42 are different depending on positions. Specifically, (a combination of) the narrow band filters 42 for respective four PDs 47 being 2×2 pixels of the narrow band light sensor 12 disposed for the G pixel 191 at the position P and (a combination of) the narrow band filters 42 for respective four PDs 47 being 2×2 pixels of the narrow band light sensor 12 disposed for the G pixel 191 at the other position P' are different in (a combination of) the pass bands.

According to the image sensor 2 in FIG. 27, the narrow band light (spectrum (image)) in different bands can be received depending on the positions of the narrow band light sensor 12 (the positions of the narrow band image sensed (captured) by the narrow band sensor 12).

As described above, when the narrow band light in different bands depending on the positions of the narrow band light sensor 12 is received, a light receiving surface of the narrow band light sensor 12 is divided into plural regions, and the narrow band light in different bands can be received per region.

Figure 28:
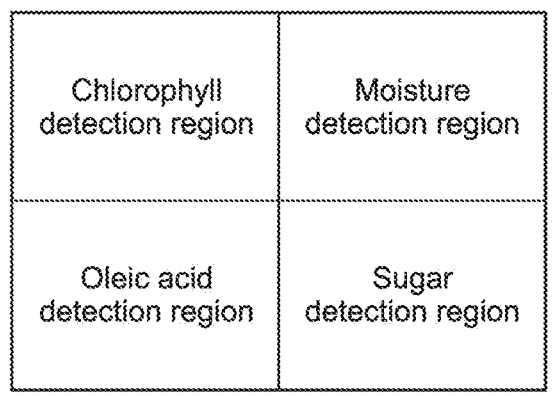
FIG. 28 is a diagram schematically showing an example of the light receiving surface of the narrow band light sensor 12, the surface being divided into plural regions.

FIG. 28 is a diagram schematically showing an example of the light receiving surface of the narrow band light sensor 12, the surface being divided into plural regions.

In FIG. 28, the light receiving surface of the narrow band light sensor 12 is divided into two equal parts in a horizontal direction and a vertical direction, and divided into four regions of top left, bottom left, top right, and bottom right.

A top left region is a chlorophyll detection region where narrow band light for detecting chlorophyll is received, and a bottom left region is oleic acid detection region where narrow band light for detecting oleic acid is received. In addition, a top right region is a moisture detection region where narrow band light for detecting moisture is received, and a bottom right region is a sugar detection region where narrow band light for detecting sugar is received.

By dividing the light receiving surface of the narrow band light sensor 12 into plural, i.e., four regions as shown in FIG. 28, and receiving the narrow band light, plural detection items, i.e., chlorophyll, moisture, oleic acid, sugar can be detected at the same time in FIG. 28.

As described above, when the digital camera 10 having the narrow band light sensor 12 including the light receiving surface divided into the four regions shown in FIG. 28 is used, for example, as the monitoring camera for the tomato farm illustrated in FIG. 4, chlorophyll, moisture, oleic acid, and sugar of the tomato can be monitored at the same time.

Figure 29:
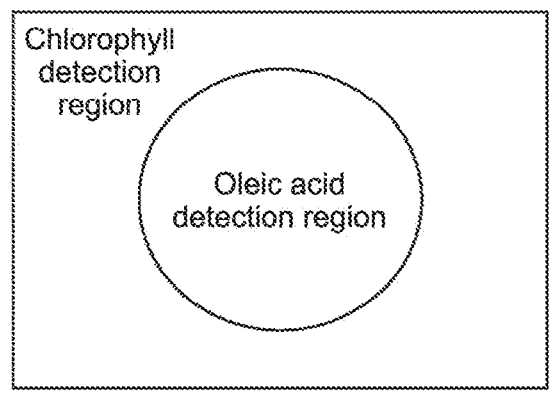
FIG. 29 is a diagram schematically showing another example of the light receiving surface of the narrow band light sensor 12, the surface being divided into plural regions.

FIG. 29 is a diagram schematically showing another example of the light receiving surface of the narrow band light sensor 12, the surface being divided into plural regions.

In FIG. 29, the light receiving surface of the narrow band light sensor 12 is divided into two regions of a circle having a predetermined radius, and a region outside the circle, and the circle having a predetermined radius is provided by centering a rectangle center of the light receiving surface.

A region within the circle is an oleic acid detection region where narrow band light for detecting oleic acid, and a region outside the circle is a chlorophyll detection region where narrow band light for detecting chlorophyll is received.

A way to divide the light receiving surface of the narrow band light sensor 12 is not especially limited. The light receiving surface of the narrow band light sensor 12 may be divided into any regions depending on the usage or others of the digital camera 10, for example.

<Seventeenth Configuration Example of Image Sensor 2>

Figure 30:
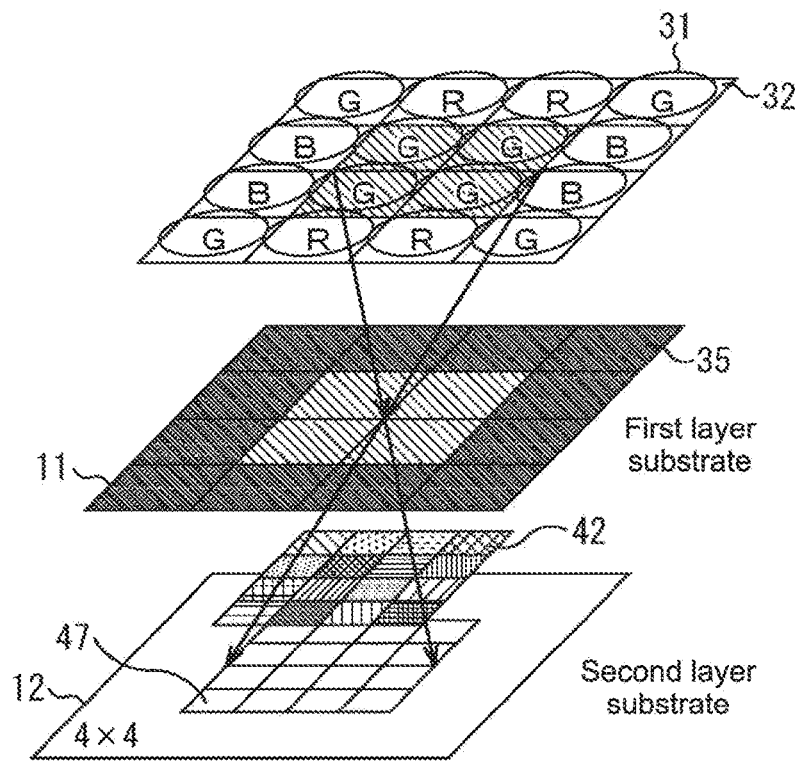
FIG. 30 is a schematic perspective view showing a seventeenth configuration example of the image sensor 2.

FIG. 30 is a schematic perspective view showing a seventeenth configuration example of the image sensor 2.

Note that, in the drawing, components corresponding to those in FIG. 13 are denoted by the same reference numerals, and thus detailed description thereof will be hereinafter omitted.

The image sensor 2 in FIG. 30 is configured similar to that in FIG. 13.

Note that, in the image sensor 2 in FIG. 13, the color array of the OCCF 32 is the Bayer array, but in the image sensor 2 in FIG. 30, the color array of the OCCF 32 is not the Bayer array but the Quadra array.

In the Quadra array, color filters of respective three colors, R, G, B are arranged in a 2×2 pixel unit.

In FIG. 30, similar to that in FIG. 13, 16 PDs 47 being plural 4×4 pixels of the narrow band light sensor 12 are disposed for four PDs 35 being plural 2×2 pixels of the visible light sensor 11.

In addition, in FIG. 30, the 2×2 pixels of the visible light sensor 11 for the 4×4 pixels of the narrow band light sensor 12 are the G pixels being 2×2 pixels of the visible light sensor 11 (pixels that permeate light permeated through the G filter).

Accordingly, in the image sensor 2 in FIG. 30, the light permeated through the respective PDs 35 being the G pixels of 2×2 pixels permeates collectively, in a manner of speaking, through the narrow band filters 42, and the resultant narrow band light is received at 4×4 pixels of the narrow band light sensor 12.

As a result, in the narrow band light sensor 12, based on a bundle of the light permeated through respective of the G pixels of the 2×2 pixels of the visible light sensor 11, the narrow band light that permeates through the narrow band filters 42 may be selected and received from the bundle of light.

Also, in the narrow band light sensor 12, as the narrow band light acquired from the bundle of the light permeated through the respective G pixels of 2×2 pixels of the visible light sensor 11, the narrow band light can be received at high sensitivity as compared to the case that the narrow band light acquired from the light permeated through one pixel of the visible light sensor 11 is received.

<Eighteenth Configuration Example of Image Sensor 2>

Figure 31:
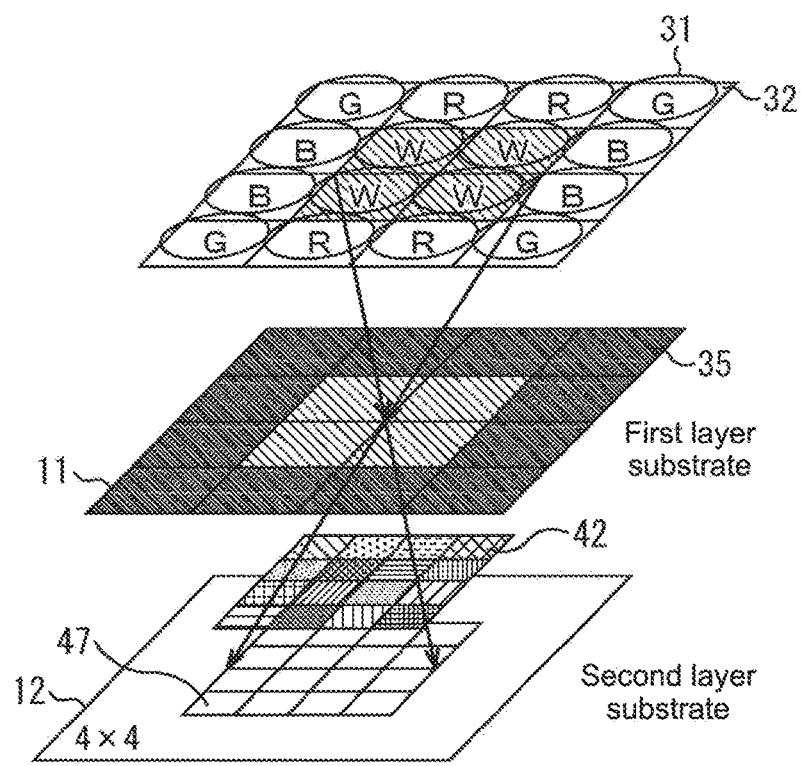
FIG. 31 is a schematic perspective view showing an eighteenth configuration example of the image sensor 2.

FIG. 31 is a schematic perspective view showing an eighteenth configuration example of the image sensor 2.

Note that, in the drawing, components corresponding to those in FIG. 30 are denoted by the same reference numerals, and thus detailed description thereof will be hereinafter omitted.

The image sensor 2 in FIG. 31 is configured similar to that in FIG. 31.

Note that, in the image sensor 2 in FIG. 30, the color array of the OCCF 32 is the Quadra array, but in the image sensor 2 in FIG. 31, the color array of the OCCF 32 is not the Quadra-White array.

In the Quadra-White array, color filters of respective four colors, R, G, B, W (White) are arranged in a 2×2 pixel unit.

In FIG. 31, similar to that in FIG. 30, 16 PDs 47 being plural 4×4 pixels of the narrow band light sensor 12 are disposed for four PDs 35 being plural 2×2 pixels of the visible light sensor 11.

In addition, in FIG. 31, the 2×2 pixels of the visible light sensor 11 for the 4×4 pixels of the narrow band light sensor 12 are the W pixels being 2×2 pixels of the visible light sensor 11 (pixels that permeate light permeated through the W filter).

Accordingly, in the image sensor 2 in FIG. 31, the light permeated through the respective PDs 35 being the W pixels of 2×2 pixels permeates collectively, in a manner of speaking, through the narrow band filters 42, and the resultant narrow band light is received at 4×4 pixels of the narrow band light sensor 12.

As a result, in the narrow band light sensor 12, based on a bundle of the light permeated through respective of the W pixels of the 2×2 pixels of the visible light sensor 11, the narrow band light that permeates through the narrow band filters 42 may be selected and received from the bundle of light.

Also, in the narrow band light sensor 12, as the narrow band light acquired from the bundle of the light permeated through the respective W pixels of 2×2 pixels of the visible light sensor 11, the narrow band light can be received at high sensitivity as compared to the case that the narrow band light acquired from the light permeated through one pixel of the visible light sensor 11 is received.

Here, for example, as shown in FIG. 13, in the image sensor 2 that adopts the OCCF 32 in the Bayer array, by selecting one or plural points of the OCCF 32, and working to change basic units of the Bayer array of 2×2 pixels in the selected points (color filter having 2×2 pixels where top left is red, bottom right is blue, bottom left and top right are green) to the W filter having 2×2 pixels, based on a bundle of light permeated through respective of the W pixel being 2×2 pixels of the visible light sensor 11, the narrow band light that permeates through the narrow band filters 42 may be selected and received from the bundle of light, and it is possible to receive the narrow band light with a high sensitivity, similar to the image sensor 2 in FIG. 31.

However, in the image sensor 2 that adopts the OCCF 32 in the Bayer array, when the basic units of the Bayer array of 2×2 pixels in the OCCF 32 are worked to change to the W filter having 2×2 pixels, the W filter having 2×2 pixels changed cannot receive the light of R, G, and B that can be acquired in the Bayer array in the visible light sensor 11. Therefore, adjacent R pixels, G pixels or B pixels are necessary to be interpolated.

In contrast, in the image sensor 2 in FIG. 31 that adopts the OCCF 32 in the Quadra-White array originally having the W filter, no interpolation is necessary.

Figure 32:
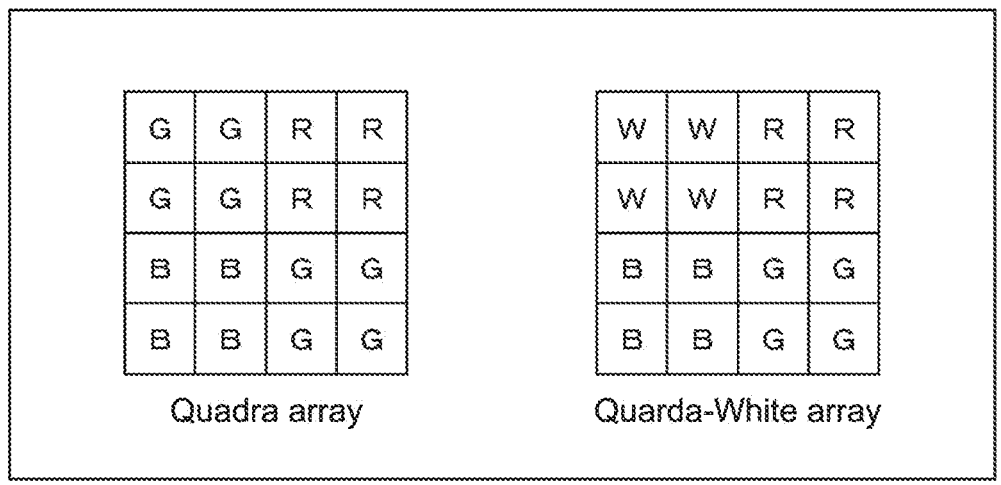
FIG. 32 is a drawing showing the Quadra array and the Quadra-White array.

FIG. 32 is a drawing showing the Quadra array and the Quadra-White array.

The Quadra array includes a color filter having 4×4 pixels as a basic unit where the G filter having 2×2 pixels at top left, the B filter having 2×2 pixels at bottom left, the R filter having 2×2 pixels at top right, the G filter having 2×2 pixels at bottom right are arranged, respectively.

The Quadra-White array includes a color filter having 4×4 pixels as a basic unit where the W filter having 2×2 pixels at top left, the B filter having 2×2 pixels at bottom left, the R filter having 2×2 pixels at top right, the G filter having 2×2 pixels at bottom right are arranged, respectively.

<Nineteenth Configuration Example of Image Sensor 2>

Figure 33:
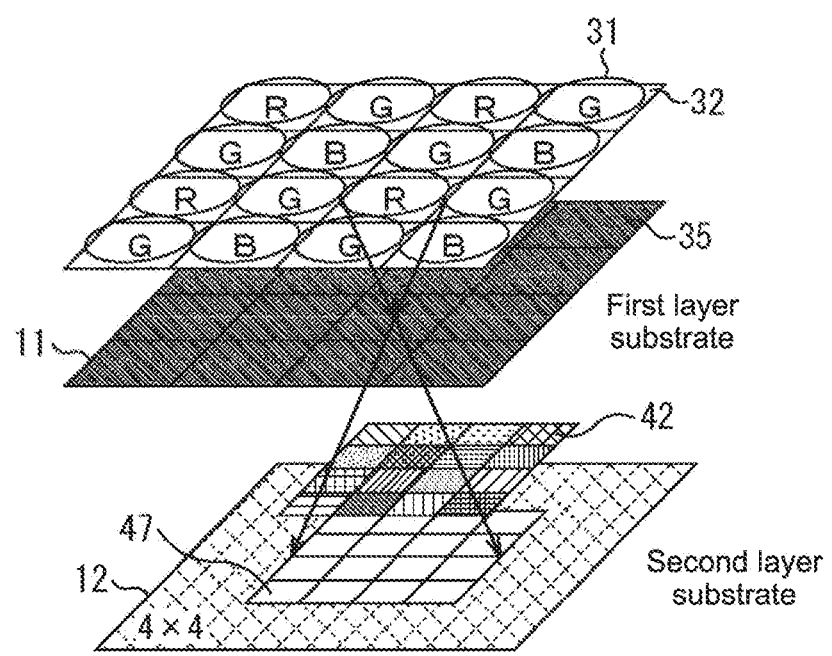
FIG. 33 is a schematic perspective view showing a nineteenth configuration example of the image sensor 2.

FIG. 33 is a schematic perspective view showing a nineteenth configuration example of the image sensor 2.

Note that, in the drawing, components corresponding to those in FIG. 18 are denoted by the same reference numerals, and thus detailed description thereof will be hereinafter omitted.

The image sensor 2 in FIG. 33 is configured similar to that in FIG. 18.

Note that the image sensor 2 in FIG. 33 is different from the image sensor 2 in FIG. 18 where the PDs 47 are configured of Si in that (the semiconductor layer 46 including) the PDs 47 being the pixels of the narrow band light sensor 12 are configured of an InGaAs based material.

As described above, in the image sensor 2 in FIG. 33, as the PDs 47 being the pixels of the narrow band light sensor 12 are configured of an InGaAs based material, the narrow band light at a long wavelength of about 700 nm or more, for example, about 0.9 to 2.6 um, where detection sensitivity is lowered in the case that the PDs 47 are configured of Si, can be detected (received) at high sensitivity.

When the PDs 47 being the pixels of the narrow band light sensor 12 are configured of the InGaAs based material, the wavelength of the narrow band light received by the PDs 47 can be adjusted within a range from about 1.5 to 3.0 um by adjusting a composition ratio of In and Ga of the InGaAs based material. In general, the greater In in the composition ratio of the InGaAs based material is, the more the narrow band light can be detected (received) at a longer wavelength side. When the narrow band light at a long wavelength can be received, it will be possible to detect moisture, etc.

<Twentieth Configuration Example of Image Sensor 2>

Figure 34:
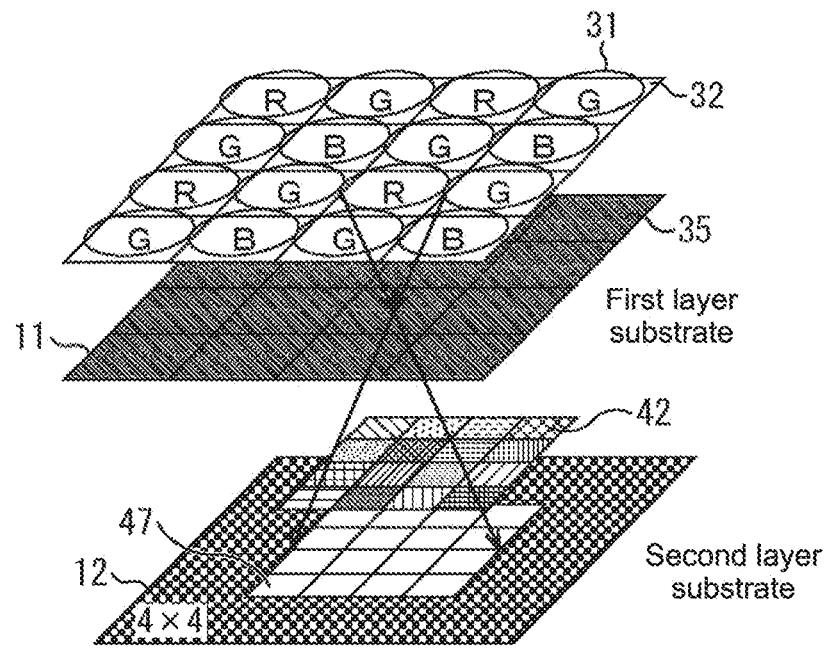
FIG. 34 is a schematic perspective view showing a twentieth configuration example of the image sensor 2.

FIG. 34 is a schematic perspective view showing a twentieth configuration example of the image sensor 2.

Note that, in the drawing, components corresponding to those in FIG. 18 are denoted by the same reference numerals, and thus detailed description thereof will be hereinafter omitted.

The image sensor 2 in FIG. 34 is configured similar to that in FIG. 18.

Note that the image sensor 2 in FIG. 34 is different from the image sensor 2 in FIG. 18 where the PDs 47 are configured of Si in that the PDs 47 being the pixels of the narrow band light sensor 12 are configured of a PbS based, PbSe based, Ge based, InAs based, InSb based, or HgCdTe based material.

As described above, in the image sensor 2 in FIG. 34, as the PDs 47 being the pixels of the narrow band light sensor 12 are configured of the PbS based, PbSe based, Ge based, InAs based, InSb based, or HgCdTe based material, the narrow band light at different wavelengths from the case that the PDs 47 are configured of Si, can be detected at high sensitivity.

The material of the PDs 47 is determined from any of the PbS based, PbSe based, Ge based, InAs based, InSb based, and HgCdTe based material by the wavelength of the narrow band light that is desirably detected (received) by the narrow band light sensor 12.

For example, when the narrow band light having a wavelength of about 1.0 to 1.6 um is desirably detected, the PDs 47 are configured of the PbS based, PbSe based, or Ge based material. For example, when the narrow band light having a wavelength of about 1.0 to 5.5 um is desirably detected, the PDs 47 are configured of the InAs based, or InSb based material.

<Twenty-Oneth Configuration Example of Image Sensor 2>

Figure 35:
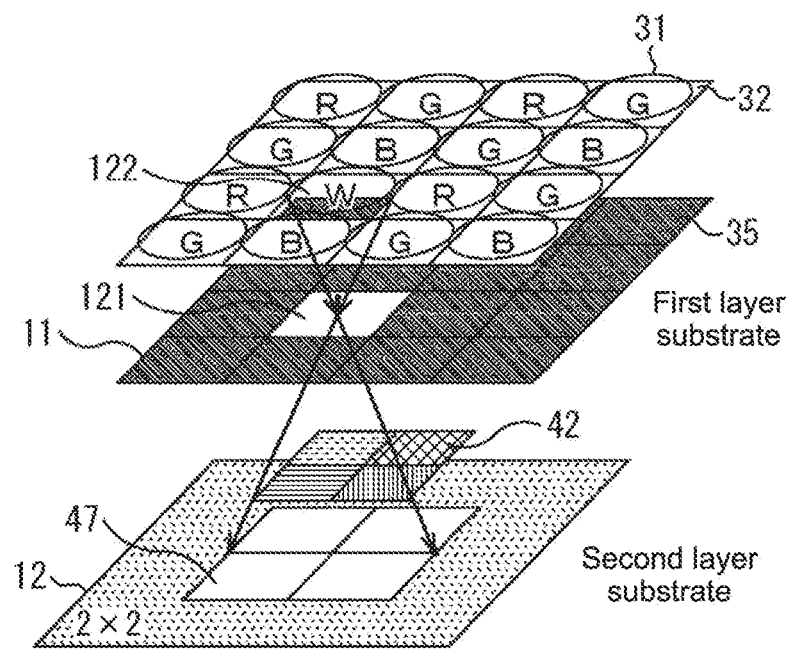
FIG. 35 is a schematic perspective view showing a twenty-oneth configuration example of the image sensor 2.

FIG. 35 is a schematic perspective view showing a twenty-oneth configuration example of the image sensor 2.

Note that, in the drawing, components corresponding to those in FIG. 17 are denoted by the same reference numerals, and thus detailed description thereof will be hereinafter omitted.

The image sensor 2 in FIG. 35 is configured similar to that in FIG. 17.

Note that the image sensor 2 in FIG. 35 is different from the image sensor 2 in FIG. 17 where the PDs 47 are configured of Si in that the PDs 47 being the pixels of the narrow band light sensor 12 are configured of a GaN based, InGaN based, or AlGaN based material.

As described above, in the image sensor 2 in FIG. 35, as the PDs 47 being the pixels of the narrow band light sensor 12 are configured of the GaN based, InGaN based, or AlGaN based material, the narrow band light at different wavelengths from the case that the PDs 47 are configured of Si, can be detected at high sensitivity.

In other words, when the PDs 47 are configured of the GaN based, InGaN based, or AlGaN based material, in the narrow band light sensor 12, the narrow band light having a short wavelength from ultraviolet to about 400 nm (about 0.2 to 0.4 um) can be detected.

As described above, when the narrow band light having a short wavelength is detected (received) by (in) the narrow band light sensor 12, it is desirable that the pixels of the visible light sensor 11 for the PDs 47 are configured of $SiO_2$ of the transparent material 121, and the color filter of the OCCF 32 for the pixels of the visible light sensor 11 is the W filter such that the narrow band light having a short wavelength arrives the PDs 47 being the pixels of the narrow band light sensor 12 with sufficient light intensity (light intensity with some degree).

The embodiments of the present technology is not limited to the above-described embodiments, and variations and modifications may be made without departing from the spirit of the present technology. For example, as to the W filter in the embodiments, a color filter (that permeates light) in yellow color (Y (Yellow) filter) having spectral characteristics relatively near to those of the W filter can be adopted in place of the W filter.

Furthermore, for example, in the embodiments, although the image sensor 2 is configured of the three substrates from the first layer substrate to the third layer substrate, the image sensor 2 may be configured by laminating two substrates or four or more, e.g., four or five substrates.

In addition, for example, in the embodiments, although one of plural substrates configuring the image sensor 2 is the visible light sensor 11 that receives visible light, and the other substrate is the narrow band light sensor 12 that receives narrow band light, the image sensor 2 may include two or more visible light sensors, or two or more narrow band light sensors.

Specifically, the image sensor 2 may be configured, for example, of four or more layers by laminating a first visible light sensor, a second visible light sensor, a first narrow band light sensor and a second narrow band light sensor from the upper layer to the lower layer. In this case, for example, simply, in the first visible light sensor, the second visible light sensor, the first narrow band light sensor, and the second narrow band light sensor, the positions of the pixels for performing photoelectric conversion are deviated, and necessary light is permeated from the upper layer to the lower layer, whereby even the second visible light sensor, the first visible light sensor, and the second visible light sensor can receive the necessary light as well as the first visible light sensor as an outermost layer.

Effects described herein are not limited only to be illustrative, there may be effects other than those described herein.

The present technology may have the following configurations.

<1> A solid-state image capturing apparatus, including:
a plurality of substrates laminated in two or more layers;
two or more substrates of the plurality of substrates having pixels that perform photoelectric conversion,
at least one substrate of the substrates having the pixels being a visible light sensor that receives visible light,
at least another substrate of the substrates having the pixels being a narrow band light sensor that includes narrow band filters being optical filters permeating light in a narrow wavelength band, and receives narrow band light in the narrow band.

<2> The solid-state image capturing apparatus according to <1>, in which
the narrow band light sensor includes a plurality of the narrow band filters that permeate light in different wavelength bands.

<3> The solid-state image capturing apparatus according to <1> or <2>, in which
the visible light sensor is laminated as an upper layer of the narrow band light sensor on a side on which light is incident.

<4> The solid-state image capturing apparatus according to <3>, in which
the narrow band light sensor includes a plurality of pixels that receive light permeated through the visible light sensor, and the narrow band filters.
<5> The solid-state image capturing apparatus according to <1> to <4>, in which
one of the visible light sensor and the narrow band light sensor that is an upper layer substrate is configured of Si, the upper layer substrate being disposed over a lower layer substrate disposed at a lower layer opposite to a side on which a light is incident, and
the other receives light permeated through the Si as the lower layer substrate.
<6> The solid-state image capturing apparatus according to <1> to <4>, in which
one of the visible light sensor and the narrow band light sensor that is an upper layer substrate is configured of $SiO_2$, the upper layer substrate being disposed over a lower layer substrate disposed at a lower layer opposite to a side on which a light is incident, and
the other receives light permeated through the $SiO_2$ as the lower layer substrate.
<7> The solid-state image capturing apparatus according to <5>, in which
a color filter being an optical filter that permeates light having a predetermined color is laminated as an upper layer of the visible light sensor and the narrow band light sensor on a side on which light is incident, and
the visible light sensor and the narrow band light sensor receive light permeated through the color filter that permeates green, red, or white color light.
<8> The solid-state image capturing apparatus according to <6>, in which
a color filter being an optical filter that permeates light having a predetermined color is laminated as an upper layer of the visible light sensor and the narrow band light sensor on a side on which light is incident, and
the visible light sensor and the narrow band light sensor receive light permeated through the color filter that permeates green, red, blue, or white light.
<9> The solid-state image capturing apparatus according to any of <1> to <8>, in which
a color filter having a predetermined array is laminated as an upper layer of the visible light sensor and the narrow band light sensor on a side on which light is incident, and
the color filter having a predetermined array includes a white color filter that permeates white light.
<10> The solid-state image capturing apparatus according to <3> or <4>, in which
an area of the light received by the narrow band light sensor being a lower layer of the visible light sensor is larger than an area of the light permeated through the visible light sensor as the upper layer.
<11> The solid-state image capturing apparatus according to <3> or <4>, in which
light permeated through the visible light sensor as the upper layer permeates through different narrow band filters depending on positions.
<12> The solid-state image capturing apparatus according to <3> or <4>, in which
the narrow band light sensor being a lower layer of the visible light sensor collectively receives light permeated through respective plurality pixels of the visible light sensor as the upper layer.
<13> The solid-state image capturing apparatus according to any of <1> to <12>, in which
the pixel of the narrow band light sensor is configured of an InGaAs based material.
<14> The solid-state image capturing apparatus according to any of <1> to <12>, in which
the pixel of the narrow band light sensor is configured of a PbS based, PbSe based, Ge based, InAs based, InSb based, or HgCdTe based material.
<15> The solid-state image capturing apparatus according to any of <1> to <12>, in which
the pixel of the narrow band light sensor is configured of a GaN based, InGaN based, or AlGaN based material.
<16> An electronic apparatus, including:
an optical system that collects light; and
a solid-state image capturing apparatus that receives light and captures an image,
the solid-state image capturing apparatus including,
a plurality of substrates laminated in two or more layers,
two or more substrates of the plurality of substrates having pixels that perform photoelectric conversion,
at least one substrate of the substrates having the pixels being a visible light sensor that receives visible light,
at least another substrate of the substrates having the pixels being a narrow band light sensor that includes narrow band filters being an optical filter permeating light in a narrow wavelength band, and receives narrow band light in the narrow band.

REFERENCE SIGNS LIST 1 optical system
2 image sensor
3 memory
4 signal processing unit
5 output unit
6 control unit
10 digital camera
11 visible light sensor
12 narrow band light sensor
13 circuit board
31 OCL
32 OCCF
33 insulation film
34 semiconductor layer
35 PD
36 Poly layer
37 wiring layer
38 wiring
41 filter layer
42 narrow band filter
43 wiring layer
44 wiring
45 Poly layer
46 semiconductor layer
47 PD
48 support substrate/circuit
61, 101 transparent material
111 W filter
112, 121 transparent material
122, 131 W filter
141, 151, 161, 171, 181, 191 transparent material

The invention claimed is:
1. A solid-state image capturing apparatus, comprising:
a plurality of substrates;
a plurality of color filters;
an insulating film; and
at least two layers configured to laminate the plurality of substrates, wherein at least two substrates of the plurality of substrates comprise a plurality of pixels configured to execute photoelectric conversion, a first substrate of the at least two substrates comprises a first set of pixels of the plurality of pixels, the first substrate is a visible light sensor configured to receive visible light, a second substrate of the at least two substrates comprises a second set of pixels of the plurality of pixels, the second substrate is a narrow band light sensor, the narrow band light sensor is configured to receive narrow band light in a narrow wavelength band of a plurality of narrow wavelength bands, based on a position of the narrow band light sensor, a pass band of a first narrow wavelength band of the plurality of narrow wavelength bands is different from a passband of a second narrow wavelength band of the plurality of narrow wavelength bands, a light receiving surface of the narrow band light sensor comprises a plurality of regions, each region of the plurality of regions of the light receiving surface receives light corresponding to one narrow wavelength band of the plurality of narrow wavelength bands, one of the visible light sensor or the narrow band light sensor includes a plurality of transparent materials, one of the first set of pixels or the second set of pixels is the plurality of transparent materials, each of the plurality of transparent materials includes silicon (Si), the narrow band light sensor includes a filter layer comprising a plurality of narrow band filters, a number of narrow band filters in the plurality of narrow band filters is same as a number of photodiodes (PDs) in a plurality of PDs of the second substrate, the visible light sensor includes a first semiconductor layer, a first poly layer, and a first wiring layer, the insulating film is between the plurality of color filters and an upper surface of the first semiconductor layer, the insulating film is in contact with the plurality of color filters and the upper surface of the first semiconductor layer, the first wiring layer includes a light shielding layer in a first part of the first wiring layer other than a second part of the first wiring layer, the second part of the first wiring layer corresponds to an upper part of the plurality of PDs of the second substrate, the narrow band light sensor includes a second semiconductor layer, a second poly layer, and a second wiring layer, the second wiring layer includes a plurality of wirings in a first region of the second wiring layer, a second region of the filter layer includes the plurality of narrow band filters, the first region of the second wiring layer is non-overlapping with the second region of the filter layer, the first region of the second wiring layer overlaps a third region of the second semiconductor layer, the third region is between a first PD of the plurality of PDs and a second PD of the plurality of PDs, and the first semiconductor layer, the first poly layer, the first wiring layer, the plurality of narrow band filters, the second wiring layer, the second poly layer, and the second semiconductor layer are stacked in this order.

2. The solid-state image capturing apparatus according to claim 1, wherein the plurality of narrow band filters is configured to permeate light in a plurality of wavelength bands.

3. The solid-state image capturing apparatus according to claim 2, wherein
the visible light sensor is laminated as an upper layer of the narrow band light sensor, and
the visible light sensor is on a first side of a light incident surface of the solid-state image capturing apparatus.

4. The solid-state image capturing apparatus according to claim 3, wherein the narrow band light sensor includes the second set of pixels configured to receive the light permeated through the visible light sensor and the plurality of narrow band filters.

5. The solid-state image capturing apparatus according to claim 4, wherein
the visible light sensor is an upper layer substrate,
the upper layer substrate is over a lower layer substrate,
the lower layer substrate is opposite to the first side of the light incident surface,
the narrow band light sensor is the lower layer substrate, and
the lower layer substrate is configured to receive the light through the upper layer substrate.

6. The solid-state image capturing apparatus according to claim 4, wherein
the visible light sensor is an upper layer substrate,
the upper layer substrate is over a lower layer substrate,
the lower layer substrate is opposite to the first side of the light incident surface,
the narrow band light sensor is the lower layer substrate, and
the lower layer substrate is configured to receive the light permeated through the upper layer substrate.

7. The solid-state image capturing apparatus according to claim 5, wherein
the plurality of color filters includes a color filter configured to permeate at least one of green light, red light, or white light,
the plurality of color filters is on the first side of the light incident surface, and
each of the visible light sensor and the narrow band light sensor is configured to receive the light permeated through the plurality of color filters.

8. The solid-state image capturing apparatus according to claim 6, wherein
the plurality of color filters includes a color filter configured to permeate at least one of green light, red light, or white light,
the plurality of color filters is on the first side of the light incident surface, and
each of the visible light sensor and the narrow band light sensor is configured to receive the light permeated through the plurality of color filters.

9. The solid-state image capturing apparatus according to claim 4, wherein
the plurality of color filters is an array arranged as an upper layer of the visible light sensor and the narrow band light sensor,
the plurality of color filters is on the first side of the light incident surface, and the plurality of color filters includes a white color filter configured to permeate white light.

10. The solid-state image capturing apparatus according to claim 4, wherein
an area of the light received by the narrow band light sensor is larger than an area of the light permeated through the visible light sensor, and
the narrow band light sensor is a lower layer of the visible light sensor.

11. The solid-state image capturing apparatus according to claim 4, wherein the light permeated through the visible light sensor further permeates through at least one narrow band filter of the plurality of narrow band filters based on positions of the plurality of narrow band filters.

12. The solid-state image capturing apparatus according to claim 4, wherein
the narrow band light sensor is a lower layer of the visible light sensor, and
the second set of pixels of the narrow band light sensor is configured to collectively receive the light permeated through the first set of pixels of the visible light sensor.

13. The solid-state image capturing apparatus according to claim 4, wherein the second set of pixels of the narrow band light sensor comprises an InGaAs based material.

14. The solid-state image capturing apparatus according to claim 4, wherein the second set of pixels of the narrow band light sensor comprises at least one of a PbS based material, a PbSe based material, a Ge based material, an InAs based material, an InSb based material, or an HgCdTe based material.

15. The solid-state image capturing apparatus according to claim 4, wherein the second set of pixels of the narrow band light sensor comprises at least one of a GaN based material, an InGaN based material, or an AlGaN based material.

16. The solid-state image capturing apparatus according to claim 1, wherein the light receiving surface includes a plurality of specific regions.

17. The solid-state image capturing apparatus according to claim 1, wherein the first substrate is in contact with the second substrate.

18. An electronic apparatus, comprising:
an optical system configured to collect light; and
a solid-state image capturing apparatus configured to:
receive the light; and
capture an image, wherein
the solid-state image capturing apparatus includes:
a plurality of substrates;
a plurality of color filters;
an insulating film; and
at least two layers configured to laminate the plurality of substrates, wherein
at least two substrates of the plurality of substrates comprise a plurality of pixels configured to execute photoelectric conversion,
a first substrate of the at least two substrates comprises a first set of pixels of the plurality of pixels,
the first substrate is a visible light sensor configured to receive visible light,
a second substrate of the at least two substrates comprises a second set of pixels of the plurality of pixels,
the second substrate is a narrow band light sensor,
the narrow band light sensor is configured to receive narrow band light in a narrow wavelength band of a plurality of narrow wavelength bands, based on a position of the narrow band light sensor,
a pass band of a first narrow wavelength band of the plurality of narrow wavelength bands is different from a passband of a second narrow wavelength band of the plurality of narrow wavelength bands,
a light receiving surface of the narrow band light sensor comprises a plurality of regions,
each region of the plurality of regions of the light receiving surface receives light corresponding to one narrow wavelength band of the plurality of narrow wavelength bands,
one of the visible light sensor or the narrow band light sensor includes a plurality of transparent materials,
one of the first set of pixels or the second set of pixels is the plurality of transparent materials,
each of the plurality of transparent materials includes silicon (Si),
the narrow band light sensor includes a filter layer comprising a plurality of narrow band filters,
a number of narrow band filters in the plurality of narrow band filters is same as a number of photodiodes (PDs) in a plurality of PDs of the second substrate,
the visible light sensor includes a first semiconductor layer, a first poly layer, and a first wiring layer,
the insulating film is between the plurality of color filters and an upper surface of the first semiconductor layer,
the insulating film is in contact with the plurality of color filters and the upper surface of the first semiconductor layer,
the first wiring layer includes a light shielding layer in a first part of the first wiring layer other than a second part of the first wiring layer,
the second part of the first wiring layer corresponds to an upper part of the plurality of PDs of the second substrate,
the narrow band light sensor includes a second semiconductor layer, a second poly layer, and a second wiring layer,
the second wiring layer includes a plurality of wirings in a first region of the second wiring layer,
a second region of the filter layer includes the plurality of narrow band filters,
the first region of the second wiring layer is non-overlapping with the second region of the filter layer,
the first region of the second wiring layer overlaps a third region of the second semiconductor layer,
the third region is between a first PD of the plurality of PDs and a second PD of the plurality of PDs, and
the first semiconductor layer, the first poly layer, the first wiring layer, the plurality of narrow band filters, the second wiring layer, the second poly layer, and the second semiconductor layer are stacked in this order.

* * * * *